United States Patent
Huang et al.

(10) Patent No.: US 10,892,213 B2
(45) Date of Patent: Jan. 12, 2021

(54) WIRING STRUCTURE AND METHOD FOR MANUFACTURING THE SAME

(71) Applicant: Advanced Semiconductor Engineering, Inc., Kaohsiung (TW)

(72) Inventors: Wen Hung Huang, Kaohsiung (TW); Li-Yu Hsieh, Kaohsiung (TW); Yan Wen Chung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/236,207

(22) Filed: Dec. 28, 2018

(65) Prior Publication Data

US 2020/0211945 A1 Jul. 2, 2020

(51) Int. Cl.
*H01L 23/498* (2006.01)
*H01L 21/48* (2006.01)
*H01L 21/66* (2006.01)
*H01L 23/544* (2006.01)
*H01L 21/683* (2006.01)
(Continued)

(52) U.S. Cl.
CPC ...... *H01L 23/49822* (2013.01); *H01L 21/486* (2013.01); *H01L 21/4857* (2013.01); *H01L 21/6835* (2013.01); *H01L 22/14* (2013.01); *H01L 23/49827* (2013.01); *H01L 23/49838* (2013.01); *H01L 23/544* (2013.01); *H05K 3/36* (2013.01); *H05K 3/4038* (2013.01); *H01L 24/16* (2013.01); *H01L 2221/68345* (2013.01); *H01L 2221/68359* (2013.01); *H01L 2223/5442* (2013.01); *H01L 2223/54426* (2013.01); *H01L 2224/16227* (2013.01)

(58) Field of Classification Search
CPC . H05K 2201/09827; H05K 2201/0352; H05K 2201/09518; H05K 1/144; H05K 1/115; H05K 3/36; H05K 3/4038; H05K 2201/09818; H01L 23/49822; H01L 23/49838; H01L 23/544; H01L 21/4857; H01L 21/486; H01L 21/6835; H01L 24/16; H01L 22/14
See application file for complete search history.

(56) References Cited

U.S. PATENT DOCUMENTS 5,191,174 A * 3/1993 Chang ................... H05K 1/115
174/266
5,731,047 A * 3/1998 Noddin ................ H05K 3/0035
427/555

(Continued)

*Primary Examiner* — Roshn K Varghese
(74) *Attorney, Agent, or Firm* — Foley & Lardner LLP

(57) ABSTRACT

A wiring structure includes an upper conductive structure, a lower conductive structure, an adhesion layer and at least one outer via. The upper conductive structure includes at least one dielectric layer and at least one circuit layer in contact with the dielectric layer. The lower conductive structure includes at least one dielectric layer and at least one circuit layer in contact with the dielectric layer. The adhesion layer is interposed between the upper conductive structure and the lower conductive structure to bond the upper conductive structure and the lower conductive structure together. The outer via extends through at least a portion of the upper conductive structure and the adhesion layer, and electrically connected to the circuit layer of the lower conductive structure.

24 Claims, 38 Drawing Sheets

(51) Int. Cl.
 H05K 3/40 (2006.01)
 H05K 3/36 (2006.01)
 H01L 23/00 (2006.01)

(56) References Cited

U.S. PATENT DOCUMENTS

| | | | | |
|---|---|---|---|---|
| 5,768,107 | A * | 6/1998 | Ouchi | H05K 1/0269 |
| | | | | 174/255 |
| 6,531,661 | B2 * | 3/2003 | Uchikawa | H05K 3/4602 |
| | | | | 174/255 |
| 7,671,281 | B2 * | 3/2010 | Kusagaya | H05K 3/4602 |
| | | | | 174/255 |
| 8,288,875 | B2 | 10/2012 | Shimizu et al. | |
| 2006/0083895 | A1 * | 4/2006 | Ikeda | B32B 3/10 |
| | | | | 428/137 |
| 2006/0284640 | A1 * | 12/2006 | Wang | H05K 3/4602 |
| | | | | 29/831 |
| 2011/0266033 | A1 * | 11/2011 | Tada | H05K 1/186 |
| | | | | 174/251 |
| 2012/0024583 | A1 * | 2/2012 | Lee | H05K 1/186 |
| | | | | 174/260 |
| 2012/0247813 | A1 * | 10/2012 | Ueda | H01L 23/49816 |
| | | | | 174/251 |
| 2014/0182889 | A1 * | 7/2014 | Shin | H05K 3/4673 |
| | | | | 174/251 |
| 2015/0053460 | A1 * | 2/2015 | Kunimoto | H05K 3/4602 |
| | | | | 174/251 |
| 2015/0282307 | A1 * | 10/2015 | Shimizu | H01L 24/13 |
| | | | | 174/264 |
| 2016/0133555 | A1 * | 5/2016 | Nakamura | H01L 23/49822 |
| | | | | 257/774 |

* cited by examiner

WIRING STRUCTURE AND METHOD FOR MANUFACTURING THE SAME

BACKGROUND

1. Field of the Disclosure

The present disclosure relates to a wiring structure, and a manufacturing method, and to a wiring structure including at least two conductive structures attached together by an adhesion layer, and a method for manufacturing the same.

2. Description of the Related Art

Along with the rapid development in electronics industry and the progress of semiconductor processing technologies, semiconductor chips are integrated with an increasing number of electronic components to achieve better electrical performance and more functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase. Thus, thickness of the semiconductor substrate may correspondingly increase, and yield of the semiconductor substrate may decrease.

SUMMARY

In some embodiments, a wiring structure includes an upper conductive structure, a lower conductive structure, an adhesion layer and at least one outer via. The upper conductive structure includes at least one dielectric layer and at least one circuit layer in contact with the dielectric layer. The lower conductive structure includes at least one dielectric layer and at least one circuit layer in contact with the dielectric layer. The adhesion layer is interposed between the upper conductive structure and the lower conductive structure to bond the upper conductive structure and the lower conductive structure together. The outer via extends through at least a portion of the upper conductive structure and the adhesion layer, and electrically connected to the circuit layer of the lower conductive structure.

In some embodiments, a method for manufacturing a wiring structure includes: (a) providing a lower conductive structure including at least one dielectric layer and at least one circuit layer in contact with the dielectric layer; (b) providing an upper conductive structure including at least one dielectric layer and at least one circuit layer in contact with the dielectric layer; and (c) attaching the upper conductive structure to the lower conductive structure.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
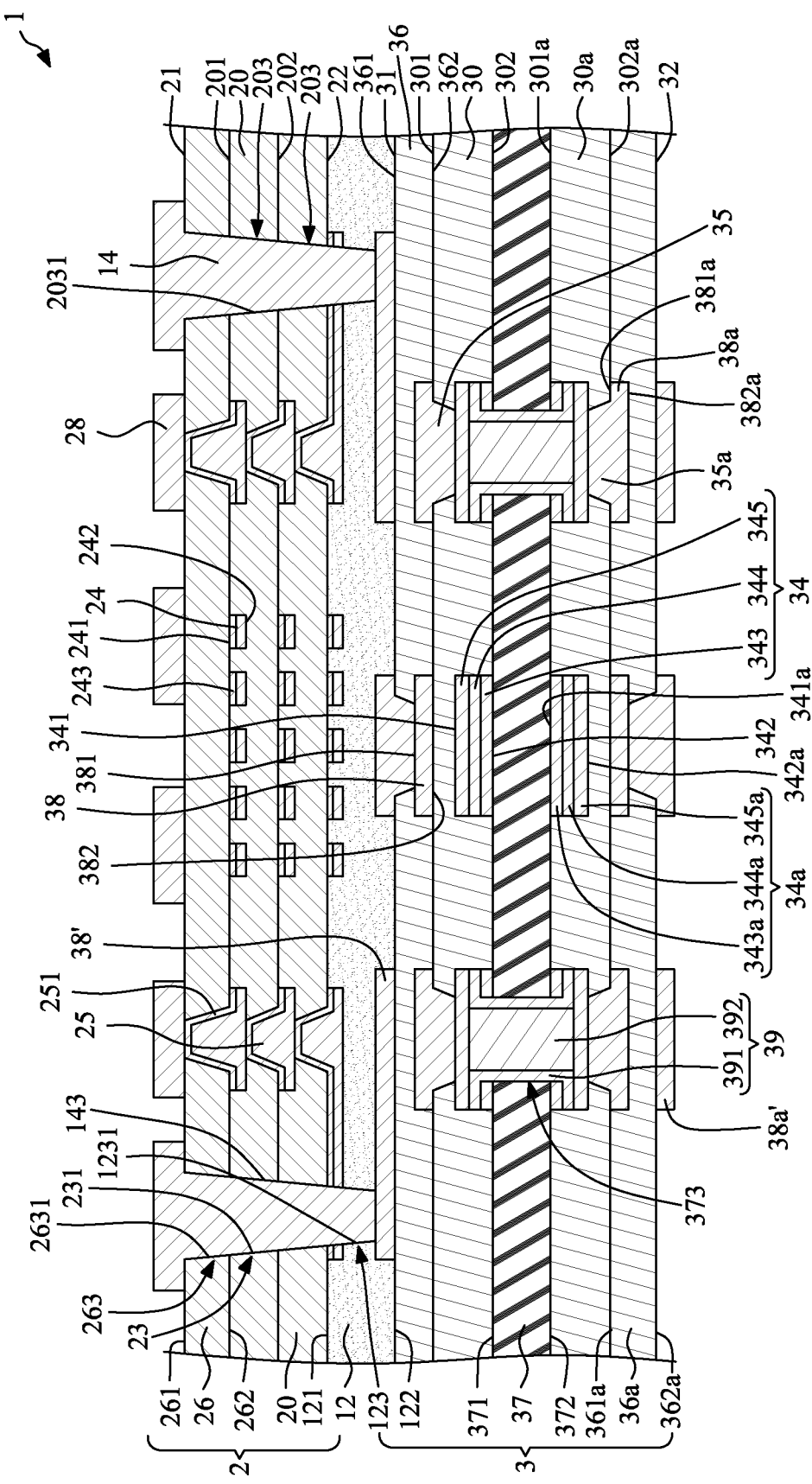
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing I/O counts, the number of the dielectric layer of a substrate should increase. In some embodiments, a manufacturing process of a core substrate may include the following stages. Firstly, a core with two copper foils disposed on two sides thereof is provided. Then, a plurality of dielectric layers and a plurality of circuit layers are formed or stacked on the two copper foils. One circuit layer may be embedded in one dielectric layer. Therefore, the core substrate may include a plurality of stacked dielectric layers and a plurality of circuit layers embedded in the dielectric layers on both sides of the core. Since a line width/line space (L/S) of the circuit layer of such core substrate may be greater than or equal to 10 micrometers (μm)/10 μm, the number of the dielectric layer of such core substrate should be relatively large. Although the manufacturing cost of such core substrate is low, the manufacturing yield for the circuit layers and the dielectric layers of such core substrate is also low, thus, the yield of such core substrate is low. In addition, the dielectric layer is relatively thicker, thus, such core substrate is relatively thicker. In a comparative embodiment, if a package has 10000 I/O counts, such core substrate may include twelve layers of circuit layer and dielectric layer. The manufacturing yield for one layer (including one circuit layer and one dielectric layer) of such core substrate may be 90%. Thus, the yield of such core substrate may be $(0.9)^{12}=28.24\%$.

To address above issues, in some embodiments, a coreless substrate is provided. The coreless substrate may include a plurality of dielectric layers and a plurality of fan-out circuit layers. In some embodiments, a manufacturing process of a coreless substrate may include the following stages. Firstly, a carrier is provided. Then, a plurality of dielectric layers and a plurality of fan-out circuit layers are formed or stacked on a surface of the carrier. One fan-out circuit layer may be embedded in one dielectric layer. Then, the carrier is removed. Therefore, the coreless substrate may include a plurality of stacked dielectric layers and a plurality of fan-out circuit layers embedded in the dielectric layers. Since a line width/line space (L/S) of the fan-out circuit layer of such coreless substrate may be less than or equal to 2 μm/2 μm, the number of the dielectric layer of such coreless substrate can be reduced. Further, the manufacturing yield for the fan-out circuit layers and the dielectric layers of such coreless substrate is high. For example, the manufacturing yield for one layer (including one fan-out circuit layer and one dielectric layer) of such coreless substrate may be 99%. However, the manufacturing cost of such coreless substrate is relatively high.

At least some embodiments of the present disclosure provide for a wiring structure which has an acceptable compromise of yield and manufacturing cost. In some embodiments, the wiring structure includes an upper conductive structure and a lower conductive structure bonded to the upper conductive structure through an adhesion layer. At least some embodiments of the present disclosure further provide for techniques for manufacturing the wiring structure.

FIG. 1 illustrates a cross-sectional view of a wiring structure 1 according to some embodiments of the present disclosure. The wiring structure 1 includes an upper conductive structure 2, a lower conductive structure 3, an adhesion layer 12 and at least one outer via 14.

The upper conductive structure 2 includes at least one dielectric layer (including, for example, two first dielectric layers 20 and a second dielectric layer 26) and at least one circuit layer (including, for example, three first circuit layers 24 and a second circuit layer 28) in contact with the dielectric layer (e.g., the first dielectric layers 20 and the second dielectric layer 26). In one embodiment, the upper conductive structure 2 may be similar to a coreless substrate, and may be in a wafer type, a panel type or a strip type. The upper conductive structure 2 has a top surface 21 and a bottom surface 22 opposite to the top surface 21, and defines a single through hole 23. The upper conductive structure 2 includes a plurality of dielectric layers (for example, two first dielectric layers 20 and a second dielectric layer 26), a plurality of circuit layers (for example, three first circuit layers 24 and a second circuit layer 28) and at least one inner via 25. The dielectric layers (e.g., the first dielectric layers 20 and the second dielectric layer 26) are stacked to each other. For example, the second dielectric layer 26 is disposed on the first dielectric layers 20, thus, the second dielectric layer 26 is the topmost dielectric layer. In one embodiment, the material of the dielectric layers (e.g., the first dielectric layers 20 and the second dielectric layer 26) is transparent, and can be seen through by human eyes or machine. That is, a mark disposed adjacent to the bottom surface 22 of the upper conductive structure 2 can be recognized or detected from the top surface 21 of the upper conductive structure 2 by human eyes or machine.

In addition, each of the first dielectric layers 20 has a top surface 201 and a bottom surface 202 opposite to the top surface 201, and defines a through hole 203 having an inner surface 2031. The second dielectric layer 26 has a top surface 261 and a bottom surface 262 opposite to the top surface 261, and defines a through hole 263 having an inner surface 2631. The bottom surface 262 of the second dielectric layer 26 is disposed on and contacts the top surface 201 of the first dielectric layer 20. Thus, the top surface 21 of the upper conductive structure 2 is the top surface 261 of the second dielectric layer 26, and the bottom surface 22 of the upper conductive structure 2 is the bottom surface 202 of the bottommost first dielectric layer 20.

As shown in FIG. 1, each of the through holes 203 of the first dielectric layers 20 tapers downward, that is, a size of a top portion of the through hole 203 is greater than a size of a bottom portion of the through hole 203. The through hole 263 of the second dielectric layer 26 also tapers downward, that is, a size of a top portion of the through hole 263 is greater than a size of a bottom portion of the through hole 263. Further, the through hole 263 of the second dielectric layer 26 is aligned with and in communication with the through holes 203 of the first dielectric layers 20. The bottom portion of the through hole 263 of the second dielectric layer 26 is disposed adjacent to or connected to the top portion of the through hole 203 of the first dielectric layer 20 under the second dielectric layer 26. The size of the bottom portion of the through hole 263 of the second dielectric layer 26 is substantially equal to the size of the top portion of the through hole 203 of the first dielectric layer 20 under the second dielectric layer 26. Thus, the inner surface 2631 of the through hole 263 of the second dielectric layer 26 is coplanar with or aligned with the inner surfaces 2031 of the through holes 203 of the first dielectric layers 20. It is noted that the above-mentioned "coplanar" surfaces may not be flat. In one embodiment, the inner surface 2631 of the through hole 263 of the second dielectric layer 26 and the inner surfaces 2031 of the through holes 203 of the first dielectric layers 20 are curved surfaces, and are portions of an inner surface 231 of the large single through hole 23 for accommodating the outer via 14. The through hole 263 of the second dielectric layer 26 and the through hole 203 of the first dielectric layer 20 are collectively configured to a portion of the single through hole 23. As shown in FIG. 1, cross-sectional views of one side of the inner surface 2631 of the through hole 263 of the second dielectric layer 26 and the inner surfaces 2031 of the through holes 203 of the first dielectric layers 20 are segments of a substantially straight line. That is, cross-sectional views of one side of the inner surface 2631 of the through hole 263 of the second dielectric layer 26 and the inner surfaces 2031 of the through holes 203 of the first dielectric layers 20 may extend along the same substantially straight line. The single through hole 23 extends through the upper conductive structure 2, that is, the single through hole 23 extends from the top surface 21 of the upper conductive structure 2 to the bottom surface 22 of the upper conductive structure 2. The single through hole 23 tapers downward.

The first circuit layers 24 may be fan-out circuit layers, and an L/S of the first circuit layers 24 may be less than or equal to 2 µm/2 µm, or less than or equal to 1.8 µm/1.8 µm. Each of the first circuit layers 24 has a top surface 241 and a bottom surface 242 opposite to the top surface 241. In one embodiment, the first circuit layer 24 is embedded in the first dielectric layer 20, and the top surface 241 of the first circuit layer 24 may be substantially coplanar with the top surface 201 of the first dielectric layer 20. In one embodiment, the first circuit layer 24 may include a seed layer 243 and a conductive metal material disposed on the seed layer 243. As shown in FIG. 1, the bottommost first circuit layer 24 is disposed on and protrudes from the bottom surface 22 of the upper conductive structure 2 (e.g., the bottom surface 202 of the bottommost first dielectric layer 20). In addition, the second circuit layer 28 is disposed on and protrudes from the top surface 21 of the upper conductive structure 2 (e.g., the top surface 261 of the second dielectric layer 26). An L/S of the second circuit layer 28 may be greater than or equal to the L/S of the first circuit layer 24. As illustrated in the embodiment of FIG. 1, there is no horizontal circuit layer is the second dielectric layer 26.

The upper conductive structure 2 includes a plurality of inner vias 25. Some of the inner vias 25 are disposed between two first circuit layers 24 for electrically connecting the two first circuit layers 24. Some of the inner vias 25 are disposed between the first circuit layer 24 and the second circuit layer 28 for electrically connecting the first circuit layer 24 and the second circuit layer 28. In one embodiment, the inner via 25 may include a seed layer 251 and a conductive metal material disposed on the seed layer 251. In one embodiment, the inner via 25 and the first circuit layer 24 may be formed integrally. The inner via 25 tapers upward. That is, a size (e.g., width) of a top portion of the inner via 25 is less than a size (e.g., width) of a bottom portion of the inner via 25. In one embodiment, a maximum width of the inner via 25 may be about 25 µm.

The lower conductive structure 3 includes at least one dielectric layer (including, for example, one first upper dielectric layer 30, one second upper dielectric layer 36, one first lower dielectric layer 30a and one second lower dielectric layer 36a) and at least one circuit layer (including, for example, one first upper circuit layer 34, two second upper circuit layers 38, 38', one first lower circuit layer 34a and two second lower circuit layers 38a, 38a') in contact with the dielectric layer (e.g., the first upper dielectric layer 30, the second upper dielectric layer 36, the first lower dielectric layer 30a and the second lower dielectric layer 36a). In one embodiment, the lower conductive structure 3 may be similar to a core substrate that further includes a core portion 37, and may be in a wafer type, a panel type or a strip type. The lower conductive structure 3 has a top surface 31 and a bottom surface 32 opposite to the top surface 31. The lower conductive structure 3 includes a plurality of dielectric layers (for example, one first upper dielectric layer 30, one second upper dielectric layer 36, one first lower dielectric layer 30a and one second lower dielectric layer 36a), a plurality of circuit layers (for example, one first upper circuit layer 34, two second upper circuit layers 38, 38', one first lower circuit layer 34a and two second lower circuit layers 38a, 38a') and at least one inner via (including, for example, a plurality of upper vias 35 and a plurality of lower vias 35a).

The core portion 37 has a top surface 371 and a bottom surface 372 opposite to the top surface 371, and defines a plurality of through holes 373 extending through the core portion 37. An interconnection via 39 is disposed or formed in the through hole 373 for vertical connection. In one embodiment, the interconnection via 39 includes a base metal layer 391 and an insulation material 392. The base metal layer 391 is disposed or formed on the side wall of the through hole 373, and defines a central through hole. The insulation material 392 fills the central through hole defined by the base metal layer 391. In one embodiment, the interconnection via 39 may solely include a bulk metal material that fills the through hole 373.

The first upper dielectric layer 30 is disposed on the top surface 371 of the core portion 37, and has a top surface 301 and a bottom surface 302 opposite to the top surface 301. Thus, the bottom surface 302 of the first upper dielectric layer 30 may contact the top surface 371 of the core portion 37. The second upper dielectric layer 36 is stacked or disposed on the first upper dielectric layer 30, and has a top surface 361 and a bottom surface 362 opposite to the top surface 361. Thus, the bottom surface 362 of the second upper dielectric layer 36 may contact the top surface 301 of the first upper dielectric layer 30, and the second upper dielectric layer 36 is the topmost dielectric layer. In addition, the first lower dielectric layer 30a is disposed on the bottom surface 372 of the core portion 37, and has a top surface 301a and a bottom surface 302a opposite to the top surface 301a. Thus, the top surface 301a of the first lower dielectric layer 30a may contact the bottom surface 372 of the core portion 37. The second lower dielectric layer 36a is stacked or disposed on the first lower dielectric layer 30a, and has a top surface 361a and a bottom surface 362a opposite to the top surface 361a. Thus, the top surface 361a of the second lower dielectric layer 36a may contact the bottom surface 302a of the first lower dielectric layer 30a, and the second lower dielectric layer 36a is the bottommost dielectric layer. As shown in FIG. 1, the top surface 31 of the lower conductive structure 3 is the top surface 361 of the second upper dielectric layer 36, and the bottom surface 32 of the lower conductive structure 3 is the bottom surface 362a of the second lower dielectric layer 36a.

A thickness of the dielectric layers (e.g., the first dielectric layers 20 and the second dielectric layer 26) of the upper conductive structure 2 is less than or equal to 40% of a thickness of the dielectric layers (e.g., the first upper dielectric layer 30, the second upper dielectric layer 36, the first lower dielectric layer 30a and the second lower dielectric layer 36a) of the lower conductive structure 3. For example, a thickness of the dielectric layers (e.g., the first dielectric layers 20 and the second dielectric layer 26) of the upper conductive structure 2 may be less than or equal to 7 µm, and a thickness of the dielectric layers (e.g., the first upper dielectric layer 30, the second upper dielectric layer 36, the first lower dielectric layer 30a and the second lower dielectric layer 36a) of the lower conductive structure 3 may be about 40 µm.

An L/S of the first upper circuit layer 34 may be greater than or equal to 10 µm/10 µm. Thus, the L/S of the first upper circuit layer 34 may be greater than or equal to five times the L/S of the first circuit layer 24 of the upper conductive structure 2. The first upper circuit layer 34 has a top surface 341 and a bottom surface 342 opposite to the top surface 341. In one embodiment, the first upper circuit layer 34 is formed or disposed on the top surface 371 of the core portion 37, and covered by the first upper dielectric layer 30. The bottom surface 342 of the first upper circuit layer 34 may contact the top surface 371 of the core portion 37. In one embodiment, the first upper circuit layer 34 may include a first metal layer 343, a second metal layer 344 and a third metal layer 345. The first metal layer 343 is disposed on the top surface 371 of the core portion 37, and may be made from a copper foil. The second metal layer 344 is disposed on the first metal layer 343, and may be a plated copper layer. The third metal layer 345 is disposed on the second metal layer 344, and may be a plated copper layer. In one embodiment, the third metal layer 345 may be omitted.

An L/S of the second upper circuit layer 38 may be greater than or equal to 10 µm/10 µm. Thus, the L/S of the second upper circuit layer 38 may be substantially equal to the L/S of the first upper circuit layer 34, and may be greater than or equal to five times the L/S of the first circuit layer 24 of the upper conductive structure 2. The second upper circuit layer 38 has a top surface 381 and a bottom surface 382 opposite to the top surface 381. In one embodiment, the second upper circuit layer 38 is formed or disposed on the top surface 301 of the first upper dielectric layer 30, and covered by the second upper dielectric layer 36. The bottom surface 382 of the second upper circuit layer 38 may contact the top surface 301 of the first upper dielectric layer 30. In one embodiment, the second upper circuit layer 38 is electrically connected to the first upper circuit layer 34 through the upper vias 35. That is, the upper vias 35 are disposed between the second upper circuit layer 38 and the first upper circuit layer 34 for electrically connecting the second upper circuit layer 38 and the first upper circuit layer 34. In one embodiment, the second upper circuit layer 38 and the upper vias 35 are formed integrally. The upper via 35 tapers downward.

In addition, in one embodiment, the second upper circuit layer 38' is disposed on and protrudes from the top surface 361 of the second upper dielectric layer 36. In one embodiment, the second upper circuit layer 38 is electrically connected to the second upper circuit layer 38' through the upper vias 35. That is, the upper vias 35 are disposed between two second upper circuit layers 38, 38' for electrically connecting the two second upper circuit layers 38, 38'. In one embodiment, the second upper circuit layer 38' and the upper vias 35 are formed integrally.

An L/S of the first lower circuit layer 34a may be greater than or equal to 10 µm/10 µm. Thus, the L/S of the first lower circuit layer 34a may be greater than or equal to five times the L/S of the first circuit layer 24 of the upper conductive structure 2. The first lower circuit layer 34a has a top surface 341a and a bottom surface 342a opposite to the top surface 341a. In one embodiment, the first lower circuit layer 34a is formed or disposed on the bottom surface 372 of the core portion 37, and covered by the first lower dielectric layer 30a. The top surface 341a of the first lower circuit layer 34a may contact the bottom surface 372 of the core portion 37. In one embodiment, the first lower circuit layer 34a may include a first metal layer 343a, a second metal layer 344a and a third metal layer 345a. The first metal layer 343a is disposed on the bottom surface 372 of the core portion 37, and may be made from a copper foil. The second metal layer 344a is disposed on the first metal layer 343a, and may be a plated copper layer. The third metal layer 345a is disposed on the second metal layer 344a, and may be a plated copper layer. In one embodiment, the third metal layer 345a may be omitted.

An L/S of the second lower circuit layer 38a may be greater than or equal to 10 µm/10 µm. Thus, the L/S of the second lower circuit layer 38a may be substantially equal to the L/S of the first upper circuit layer 34, and may be greater than or equal to five times the L/S of the first circuit layer 24 of the upper conductive structure 2. The second lower circuit layer 38a has a top surface 381a and a bottom surface 382a opposite to the top surface 381a. In one embodiment, the second lower circuit layer 38a is formed or disposed on the bottom surface 302a of the first lower dielectric layer 30a, and covered by the second lower dielectric layer 36a. The top surface 381a of the second lower circuit layer 38a may contact the bottom surface 302a of the first lower dielectric layer 30a. In one embodiment, the second lower circuit layer 38a is electrically connected to the first lower circuit layer 34a through the lower vias 35a. That is, the lower vias 35a are disposed between the second lower circuit layer 38a and the first lower circuit layer 34a for electrically connecting the second lower circuit layer 38a and the first lower circuit layer 34a. In one embodiment, the second lower circuit layer 38a and the lower vias 35a are formed integrally. The lower vias 35a tapers upward.

In addition, in one embodiment, the second lower circuit layer 38a' is disposed on and protrudes from the bottom surface 362a of the second lower dielectric layer 36a. In one embodiment, the second lower circuit layer 38a' is electrically connected to the second upper circuit layer 38 through the lower vias 35a. That is, the lower vias 35a are disposed between two second lower circuit layers 38a, 38a' for electrically connecting the two second lower circuit layers 38a, 38a'. In one embodiment, the second lower circuit layer 38a' and the lower vias 35a are formed integrally.

In one embodiment, the interconnection via 39 electrically connects the first upper circuit layer 34 and the first lower circuit layer 34a. The base metal layer 391 of the interconnection via 39, the second metal layer 344 of the first upper circuit layer 34 and the second metal layer 344a the first lower circuit layer 34a may be formed integrally and concurrently.

The adhesion layer 12 is interposed between the upper conductive structure 2 and the lower conductive structure 3 to bond the upper conductive structure 2 and the lower conductive structure 3 together. That is, the adhesion layer 12 adheres the bottom surface 22 of the upper conductive structure 2 and the top surface 31 of the lower conductive structure 3. The adhesion layer 12 has a top surface 121 and a bottom surface 122 opposite to the top surface 121, and defines at least one through hole 123 having an inner surface 1231. The top surface 121 of the adhesion layer 12 may contact the bottom surface 22 of the upper conductive structure 2 (that is, the bottom surface 22 of the upper conductive structure 2 is attached to the top surface 121 of the adhesion layer 12), and the bottom surface 122 of the adhesion layer 12 may contact the top surface 31 of the lower conductive structure 3. Thus, the bottommost first circuit layer 24 of the upper conductive structure 2 and the second upper circuit layer 38' of the lower conductive structure 3 are embedded in the adhesion layer 12. In one embodiment, a bonding force between two dielectric layers (e.g., two first dielectric layers 20) of the upper conductive structure 2 is greater than a bonding force between a dielectric layer (e.g., the bottommost first dielectric layers 20) of the upper conductive structure 2 and the adhesion layer 12. A surface roughness of a boundary between two dielectric layers (e.g., two first dielectric layers 20) of the upper conductive structure 2 is greater than a surface roughness of a boundary between a dielectric layer (e.g., the bottommost first dielectric layers 20) of the upper conductive structure 2 and the adhesion layer 12.

In one embodiment, the material of the adhesion layer 12 is transparent, and can be seen through by human eyes or machine. That is, a mark disposed adjacent to the top surface 31 of the lower conductive structure 3 can be recognized or detected from the top surface 21 of the upper conductive structure 2 by human eyes or machine.

The through hole 123 extends through the adhesion layer 12. In one embodiment, the through hole 123 of the adhesion layer 12 extends through the bottommost first circuit layer 24 of the upper conductive structure 2 and stops on a topmost circuit layer (e.g., the second upper circuit layer 38') of the lower conductive structure 3. That is, the through hole 123 of the adhesion layer 12 does not extend through the topmost circuit layer (e.g., the second upper circuit layer 38') of the lower conductive structure 3. The through hole 123 of the adhesion layer 12 may expose a portion of the topmost circuit layer (e.g., the top surface of the second upper circuit layer 38') of the lower conductive structure 3. As shown in FIG. 1, the through hole 123 of the adhesion layer 12 tapers downward, that is, a size of a top portion of the through hole 123 is greater than a size of a bottom portion of the through hole 123. Further, the through hole 123 of the adhesion layer 12 is aligned with and in communication with the through holes 203 of the first dielectric layers 20 and the through hole 263 of the second dielectric layer 26. The bottom portion of through hole 203 of the bottommost first dielectric layer 20 is disposed adjacent to or connected to the top portion of the through hole 123 of the adhesion layer 12. The size of the bottom portion of the through hole 203 of the bottommost first dielectric layer 20 is substantially equal to the size of the top portion of the through hole 123 of the adhesion layer 12. Thus, the inner surface 1231 of the through hole 123 of the adhesion layer 12 is coplanar with or aligned with the inner surfaces 2031 of the through holes 203 of the first dielectric layers 20 and the inner surface 2631 of the through hole 263 of the second dielectric layer 26. In one embodiment, inner surface 1231 of the through hole 123 of the adhesion layer 12 is a curved surface, and is a portion of an inner surface 231 of the large single through hole 23 for accommodating the outer via 14. The through hole 123 of the adhesion layer 12, the through hole 203 of the first dielectric layer 20 and the through hole 263 of the second dielectric layer 26 are collectively configured to the single through hole 23. Thus, the single through hole 23 includes the through hole 123 of the adhesion layer 12, the through hole 203 of the first dielectric layer 20 and the through hole 263 of the second dielectric layer 26.

As shown in FIG. 1, cross-sectional views of one side of the through hole 123 of the adhesion layer 12, the inner surfaces 2031 of the through holes 203 of the first dielectric layers 20 and the inner surface 2631 of the through hole 263 of the second dielectric layer 26 are segments of a substantially straight line. That is, cross-sectional views of one side of the inner surface 1231 of the through hole 123 of the adhesion layer 12, the inner surfaces 2031 of the through holes 203 of the first dielectric layers 20 and the inner surface 2631 of the through hole 263 of the second dielectric layer 26 may extend along the same substantially straight line. The single through hole 23 extends through the upper conductive structure 2 and the adhesion layer 12, that is, the single through hole 23 extends from the top surface 21 of the upper conductive structure 2 to the bottom portion of the adhesion layer 12 to expose a portion of the topmost circuit layer (e.g., the top surface of the second upper circuit layer 38') of the lower conductive structure 3. The single through hole 23 tapers downward. A maximum width of the single through hole 23 may be about 25 μm to 60 μm.

The outer via 14 is formed or disposed in the single through hole 23. Thus, the outer via 14 extends through at least a portion of the upper conductive structure 2 and the adhesion layer 12, and is electrically connected to the topmost circuit layer (e.g., the top surface of the second upper circuit layer 38') of the lower conductive structure 3. As shown in FIG. 1, the outer via 14 extends through and contacts the bottommost first circuit layer 24 of the upper conductive structure 2, and stops on and contacts a portion of the topmost circuit layer (e.g., the top surface of the second upper circuit layer 38') of the lower conductive structure 3. The outer via 14 extends from the top surface 21 of the upper conductive structure 2 to the bottom surface 122 of the adhesion layer 12. Thus, the outer via 14 extends to contact a portion of the lower conductive structure 3, and the outer via 14 does not extend through the lower conductive structure 3. Further, the outer via 14 tapers downward, that is, a size of a top portion of the outer via 14 is greater than a size of a bottom portion of the outer via 14. Thus, a tapering direction of the inner via 25 of the upper conductive structure 2 is different from a tapering direction of the outer via 14. In one embodiment, the outer via 14 is a monolithic structure or a bulk structure, and a peripheral surface of the outer via 14 is a substantially continuous plane. The outer via 14 and the second circuit layer 28 may be formed integrally.

As shown in the embodiment illustrated in FIG. 1, the wiring structure 1 is a combination of the upper conductive structure 2 and the lower conductive structure 3, in which the first circuit layer 24 of the upper conductive structure 2 has fine pitch, high yield and low thickness; and the circuit layers (for example, the first upper circuit layer 34, the second upper circuit layers 38, 38', the first lower circuit layer 34a and the second lower circuit layers 38a, 38a') of the lower conductive structure 3 have low manufacturing cost. Thus, the wiring structure 1 has an acceptable compromise of yield and manufacturing cost, and the wiring structure 1 has a relatively low thickness. In one embodiment, if a package has 10000 I/O counts, the wiring structure 1 includes three layers of the first circuit layer 24 of the upper conductive structure 2 and six layers of the circuit layers (for example, the first upper circuit layer 34, the second upper circuit layers 38, 38', the first lower circuit layer 34a and the second lower circuit layers 38a, 38a') of the lower conductive structure 3. The manufacturing yield for one layer of the first circuit layer 24 of the upper conductive structure 2 may be 99%, and the manufacturing yield for one layer of the circuit layers (for example, the first upper circuit layer 34, the second upper circuit layers 38, 38', the first lower circuit layer 34a and the second lower circuit layers 38a, 38a') of the lower conductive structure 3 may be 90%. Thus, the yield of the wiring structure 1 may be improved. In addition, during the manufacturing process, the lower conductive structure 3 and the upper conductive structure 2 may be tested individually before being bonded together. Therefore, known good lower conductive structure 3 and known good upper conductive structure 2 may be bonded together. Bad (or unqualified) lower conductive structure 3 and bad (or unqualified) upper conductive structure 2 may be discarded. As a result, the yield of the wiring structure 1 may be further improved.

Figure 2:
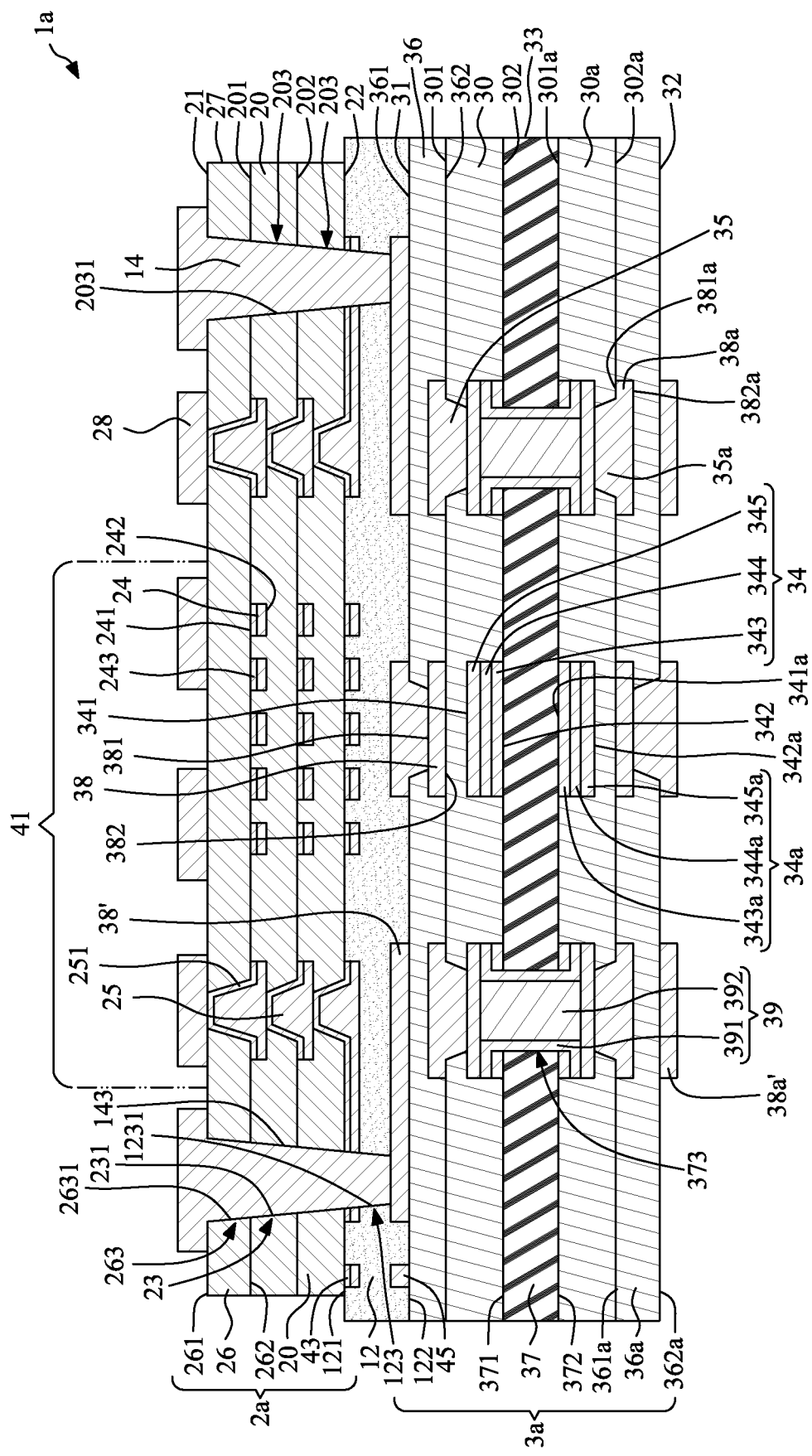
FIG. 2 illustrates a cross-sectional view of a wiring structure according to some embodiments of the present disclosure.

FIG. 2 illustrates a cross-sectional view of a wiring structure 1a according to some embodiments of the present disclosure. The wiring structure 1a is similar to the wiring structure 1 shown in FIG. 1, except for the structures of the upper conductive structure 2a and the lower conductive structure 3a. As shown in FIG. 2, the upper conductive structure 2a and the lower conductive structure 3a are both strip structures. Thus, the wiring structure 1a is a strip structure. In one embodiment, the lower conductive structure 3a may be a panel structure that carries a plurality of strip upper conductive structures 2a. Thus, the wiring structure 1a is a panel structure. The upper conductive structure 2a has at least one chip bonding area 41 for receiving at least one semiconductor chip 42 (FIG. 3), and a length (e.g., 240 mm) of the upper conductive structure 2a is greater than a width (e.g., 95 mm) of the upper conductive structure 2a from a top view. Further, a length of the lower conductive structure 3a is greater than a width of the lower conductive structure 3a from a top view. In addition, a lateral peripheral surface 27 of the upper conductive structure 2a is not coplanar with a lateral peripheral surface 33 of the lower conductive structure 3a. In one embodiment, during the manufacturing process, the lower conductive structure 3a and the upper conductive structure 2a may be both known good strip structures. Alternatively, the upper conductive structure 2a may be a known good strip structure, and the lower conductive structure 3a may be a known good panel structure. As a result, the yield of the wiring structure 1a may be further improved.

As shown in FIG. 2, the upper conductive structure 2a has at least one fiducial mark 43 at a corner thereof, and the lower conductive structure 3a has at least one fiducial mark 45 at a corner thereof. The fiducial mark 43 of the upper conductive structure 2a is aligned with the fiducial mark 45 of the lower conductive structure 3a during a manufacturing process, so that the relative position of the upper conductive structure 2a and the lower conductive structure 3a are secured. In one embodiment, the fiducial mark 43 of the upper conductive structure 2a is disposed on and protrudes from the bottom surface 22 of the upper conductive structure 2a (e.g., the bottom surface 202 of the bottommost first dielectric layer 20). The fiducial mark 43 and the bottommost first circuit layer 24 may be at the same layer, and may be formed concurrently. Further, the fiducial mark 45 of the lower conductive structure 3a is disposed on and protrudes from the top surface 31 of the lower conductive structure 3a (e.g., the top surface 361 of the second upper dielectric layer 36). The fiducial mark 45 and the second upper circuit layer 38' may be at the same layer, and may be formed concurrently.

Figure 2A:
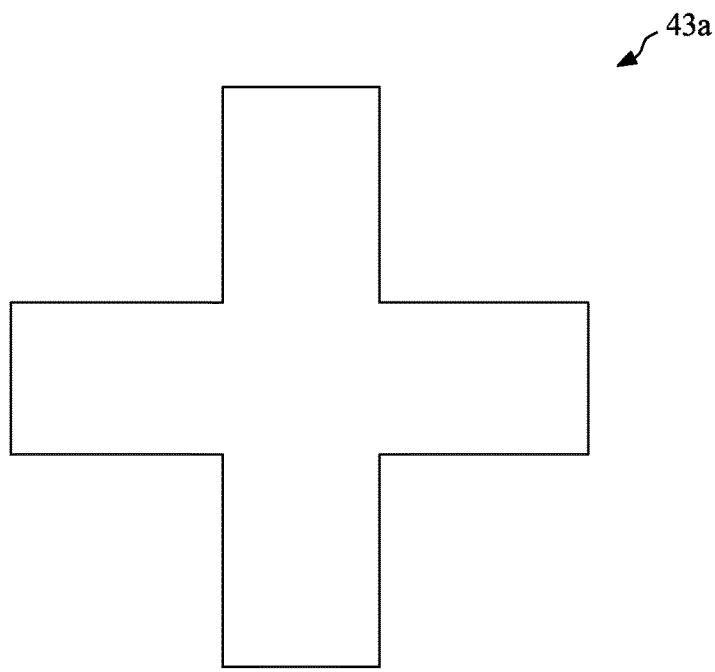
FIG. 2A illustrates a top view of an example of a fiducial mark of the upper conductive structure according to some embodiments of the present disclosure.

FIG. 2A illustrates a top view of an example of a fiducial mark 43a of the upper conductive structure 2a according to some embodiments of the present disclosure. The fiducial mark 43a of the upper conductive structure 2a is a cross shape.

Figure 2B:
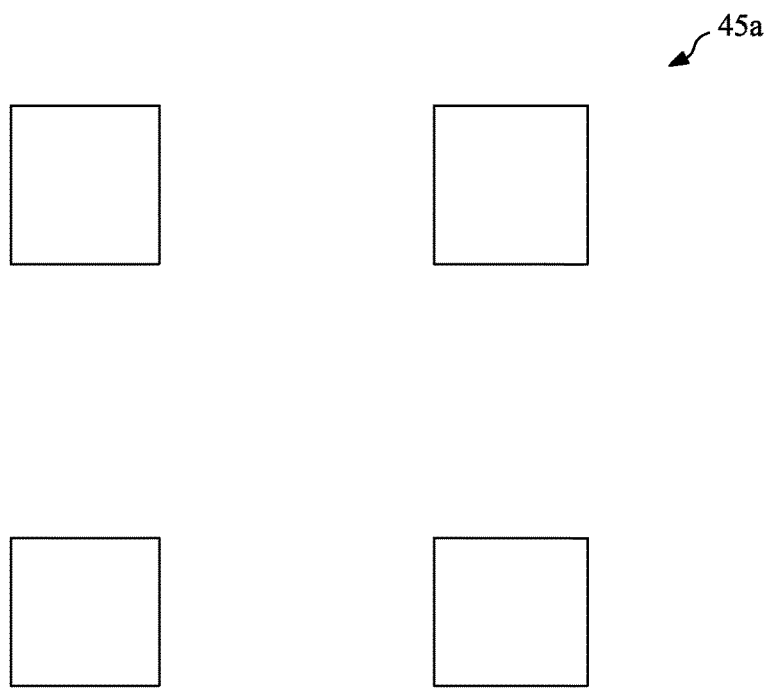
FIG. 2B illustrates a top view of an example of a fiducial mark of the lower conductive structure according to some embodiments of the present disclosure.

FIG. 2B illustrates a top view of an example of a fiducial mark 45a of the lower conductive structure 3a according to some embodiments of the present disclosure. The fiducial mark 45a of the lower conductive structure 3a includes four squares at four corners.

Figure 2C:
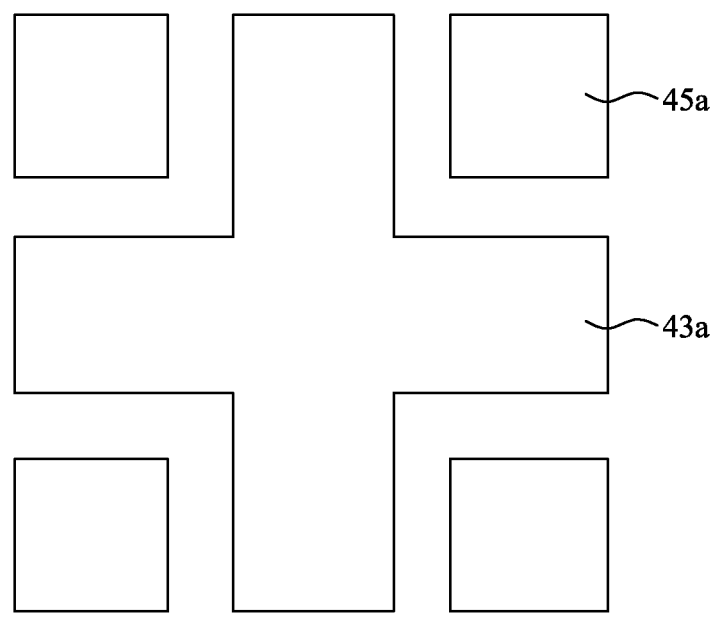
FIG. 2C illustrates a top view of a combination image of the fiducial mark of the upper conductive structure of FIG. 2A and the fiducial mark of the lower conductive structure of FIG. 2B.

FIG. 2C illustrates a top view of a combination image of the fiducial mark 43a of the upper conductive structure 2a of FIG. 2A and the fiducial mark 45a of the lower conductive structure 3a of FIG. 2B. When the upper conductive structure 2a is aligned with the lower conductive structure 3a precisely, the combination image shows the complete fiducial mark 43a and the complete fiducial mark 45a, as shown in FIG. 2C. That is, the fiducial mark 43a does not cover the fiducial mark 45a.

Figure 2D:
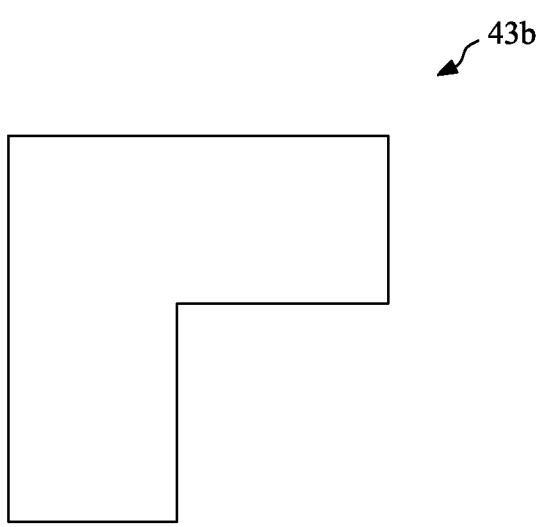
FIG. 2D illustrates a top view of an example of a fiducial mark of the upper conductive structure according to some embodiments of the present disclosure.

FIG. 2D illustrates a top view of an example of a fiducial mark 43b of the upper conductive structure 2a according to some embodiments of the present disclosure. The fiducial mark 43b of the upper conductive structure 2a is a reversed "L" shape.

Figure 2E:
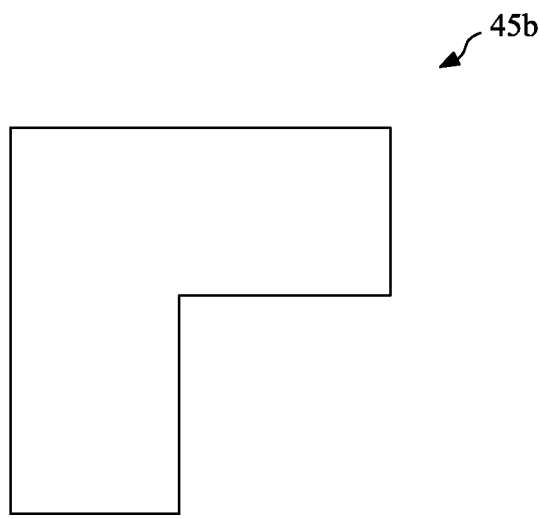
FIG. 2E illustrates a top view of an example of a fiducial mark of the lower conductive structure according to some embodiments of the present disclosure.

FIG. 2E illustrates a top view of an example of a fiducial mark 45b of the lower conductive structure 3a according to some embodiments of the present disclosure. The fiducial mark 45b of the lower conductive structure 3a is a reversed "L" shape which is substantially equal to the fiducial mark 43b of the upper conductive structure 2a.

Figure 2F:
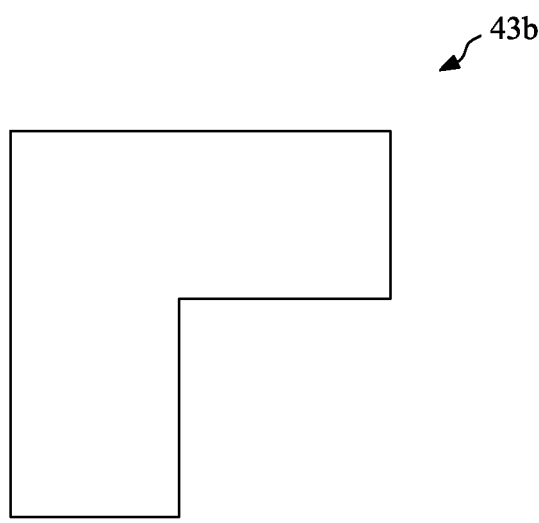
FIG. 2F illustrates a top view of a combination image of the fiducial mark of the upper conductive structure of FIG. 2D and the fiducial mark of the lower conductive structure of FIG. 2E.

FIG. 2F illustrates a top view of a combination image of the fiducial mark 43b of the upper conductive structure 2a of FIG. 2D and the fiducial mark 45b of the lower conductive structure 3a of FIG. 2E. When the upper conductive structure 2a is aligned with the lower conductive structure 3a precisely, the combination image shows solely the fiducial mark 43b of the upper conductive structure 2a, as shown in FIG. 2F. That is, the fiducial mark 43b completely covers the fiducial mark 45b.

Figure 2G:
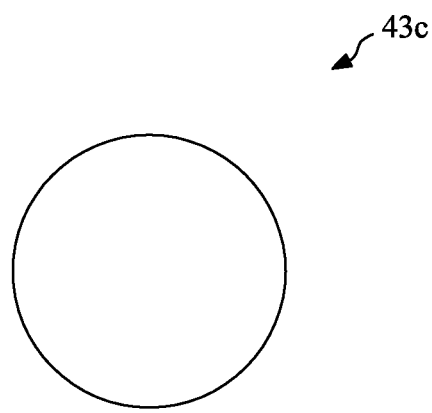
FIG. 2G illustrates a top view of an example of a fiducial mark of the upper conductive structure according to some embodiments of the present disclosure.

FIG. 2G illustrates a top view of an example of a fiducial mark 43c of the upper conductive structure 2a according to some embodiments of the present disclosure. The fiducial mark 43c of the upper conductive structure 2a is a circle.

Figure 2H:
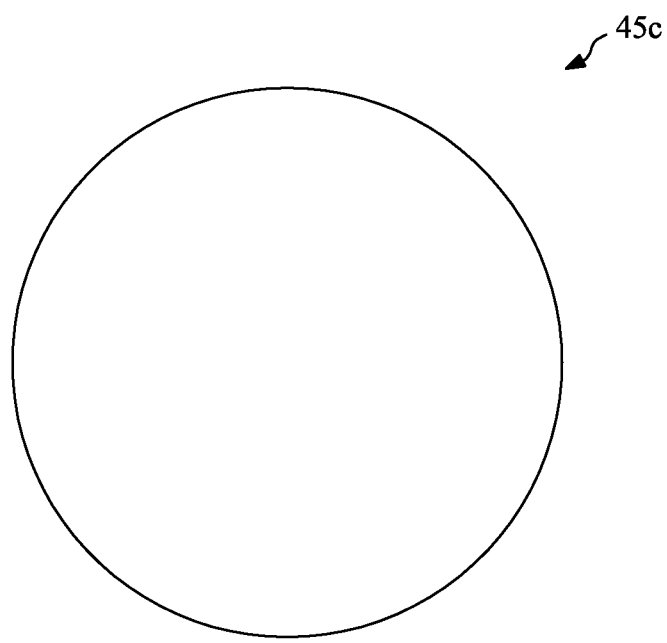
FIG. 2H illustrates a top view of an example of a fiducial mark of the lower conductive structure according to some embodiments of the present disclosure.

FIG. 2H illustrates a top view of an example of a fiducial mark 45c of the lower conductive structure 3a according to some embodiments of the present disclosure. The fiducial mark 45c of the lower conductive structure 3a is a circle which is bigger than the fiducial mark 43c of the upper conductive structure 2a.

Figure 2I:
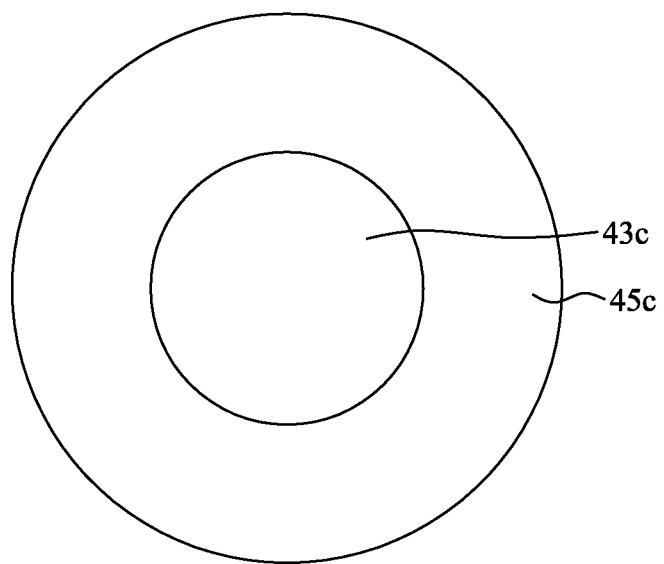
FIG. 2I illustrates a top view of a combination image of the fiducial mark of the upper conductive structure of FIG. 2G and the fiducial mark of the lower conductive structure of FIG. 2H.

FIG. 2I illustrates a top view of a combination image of the fiducial mark 43c of the upper conductive structure 2a of FIG. 2G and the fiducial mark 45c of the lower conductive structure 3a of FIG. 2H. When the upper conductive structure 2a is aligned with the lower conductive structure 3a precisely, the combination image shows two concentric circles, as shown in FIG. 2I. That is, the fiducial mark 43c is disposed at the center of the fiducial mark 45b.

Figure 3:
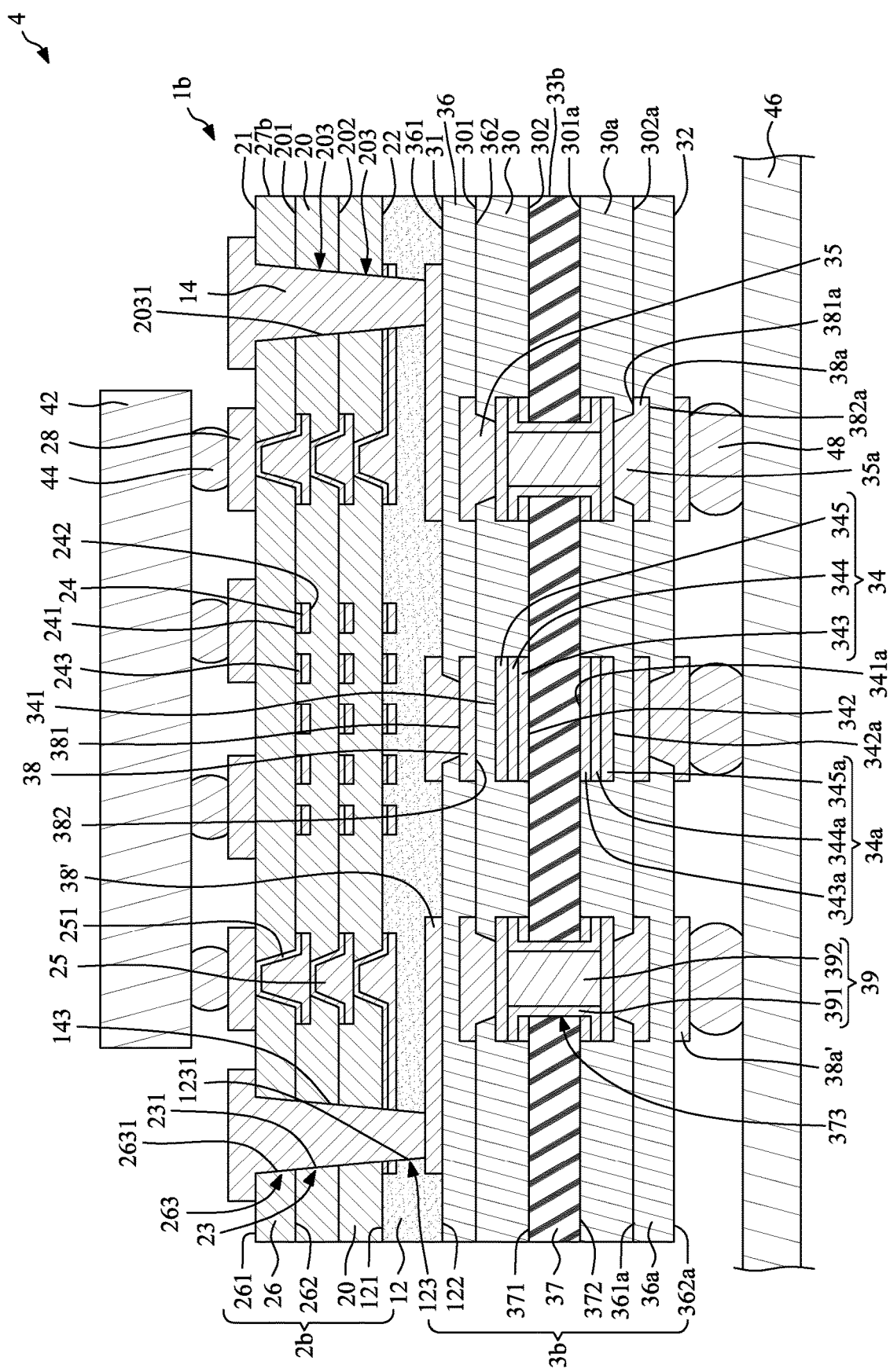
FIG. 3 illustrates a cross-sectional view of a bonding of a package structure and a substrate.

FIG. 3 illustrates a cross-sectional view of a bonding of a package structure 4 and a substrate 46. The package structure 4 includes a wiring structure 1b, a semiconductor chip 42, a plurality of first connecting elements 44 and a plurality of second connecting elements 48. The wiring structure 1b of FIG. 3 is similar to the wiring structure 1 shown in FIG. 1, except for the structures of the upper conductive structure 2b and the lower conductive structure 3b. The upper conductive structure 2b and the lower conductive structure 3b are both dice and may be singulated concurrently. Thus, the wiring structure 1b is a unit structure. That is, a lateral peripheral surface 27b of the upper conductive structure 2b, a lateral peripheral surface 33b of the lower conductive structure 3b and a lateral peripheral surface of the adhesion layer 12 are substantially coplanar with each other. The semiconductor chip 42 is electrically connected and bonded to the second circuit layer 28 of the upper conductive structure 2b through the first connecting elements 44 (e.g., solders or bumps). The second upper circuit layer 38' of the lower conductive structure 3b is electrically connected and bonded to the substrate 46 (e.g., a mother board such as a PCB board) through the second connecting elements 48 (e.g., solders or bumps).

Figure 4:
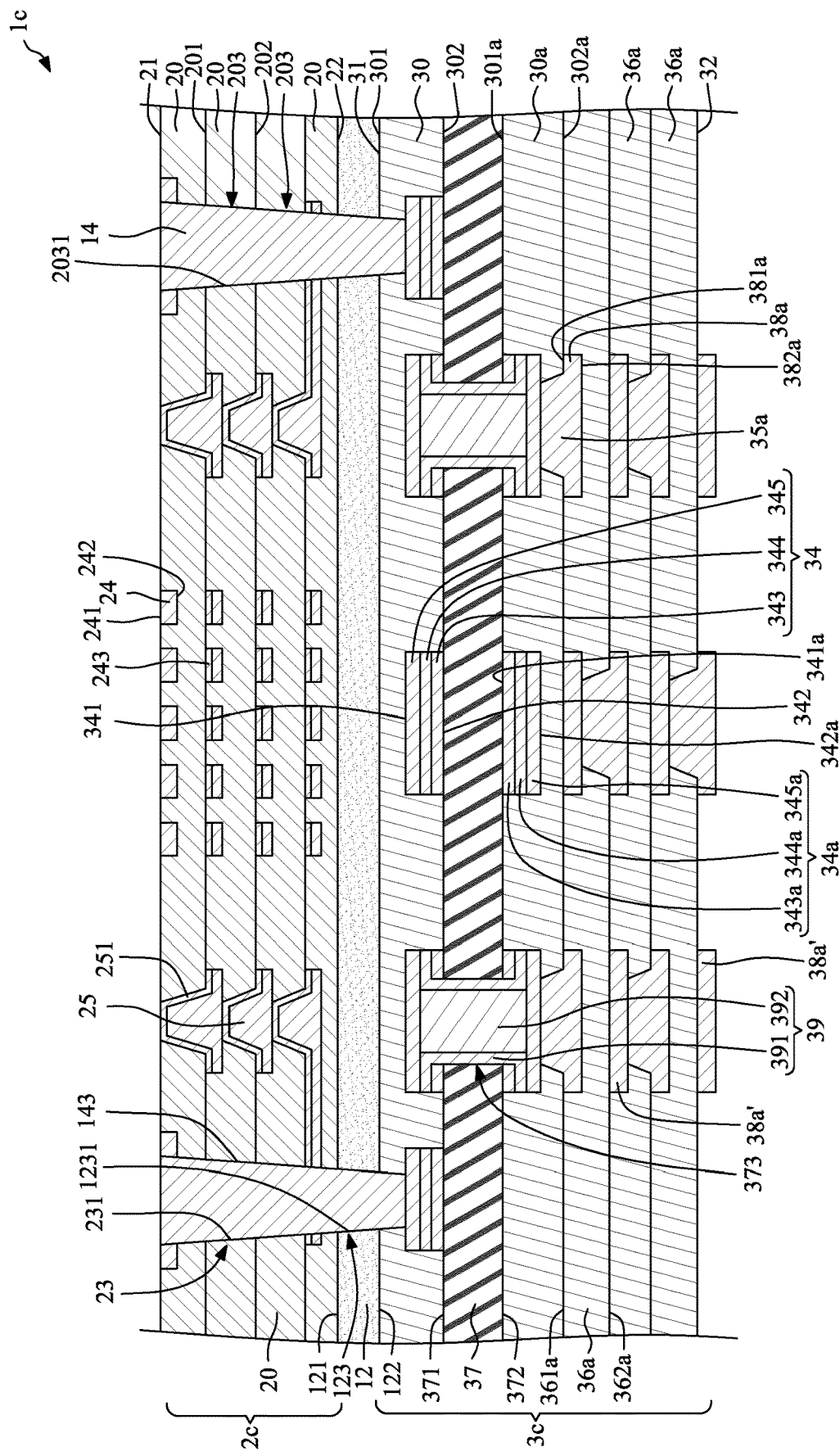
FIG. 4 illustrates a cross-sectional view of a wiring structure according to some embodiments of the present disclosure.

FIG. 4 illustrates a cross-sectional view of a wiring structure 1c according to some embodiments of the present disclosure. The wiring structure 1c is similar to the wiring structure 1 shown in FIG. 1, except for the structures of the upper conductive structure 2c and the lower conductive structure 3c. In the upper conductive structure 2c, the second dielectric layer 26 is replaced by the topmost first dielectric layer 20, and the second circuit layer 28 is replaced by the topmost first circuit layer 24. The topmost first circuit layer 24 may not include the seed layer, and may be electrically connected to the below first circuit layer 24 through the inner vias 25. The top surface 241 of the topmost first circuit layer 24 may be substantially coplanar with the top surface 21 of the upper conductive structure 2c (e.g., the top surface 201 of the topmost first dielectric layer 20). Thus, the top surface 241 of the topmost first circuit layer 24 may be exposed from the top surface 21 of the upper conductive structure 2c (e.g., the top surface 201 of the topmost first dielectric layer 20). The outer via 14 may extend through and contact the topmost first circuit layer 24. Further, the bottommost first dielectric layer 20 may cover the bottommost first circuit layer 24. Thus, the entire bottom surface 22 of the upper conductive structure 2c (e.g., the bottom surface 202 of the bottommost first dielectric layer 20) is substantially flat.

In the lower conductive structure 3c, the second upper dielectric layer 36 and the second upper circuit layers 38, 38' are omitted. Thus, the top surface 31 of the lower conductive structure 3c is the stop surface 301 of first upper dielectric layer 30, which is substantially flat. Further, two additional second lower dielectric layers 36a and two additional two second lower circuit layers 38a' are further included.

The adhesion layer 12 adheres the bottom surface 22 of the upper conductive structure 2c and the top surface 31 of the lower conductive structure 3c. Thus, the entire top surface 121 and the entire bottom surface 122 of the adhesion layer 12 are both substantially flat. The adhesion layer 12 does not include or contact a horizontal circuit layer. That is, there is no horizontal circuit layer disposed in or embedded in the adhesion layer 12. The outer via 14 extends through the upper conductive structure 2c and the adhesion layer 12, and further extends into a portion (e.g., the first upper dielectric layer 30) of the lower conductive structure 3c to contact the first upper circuit layer 34.

Figure 5:
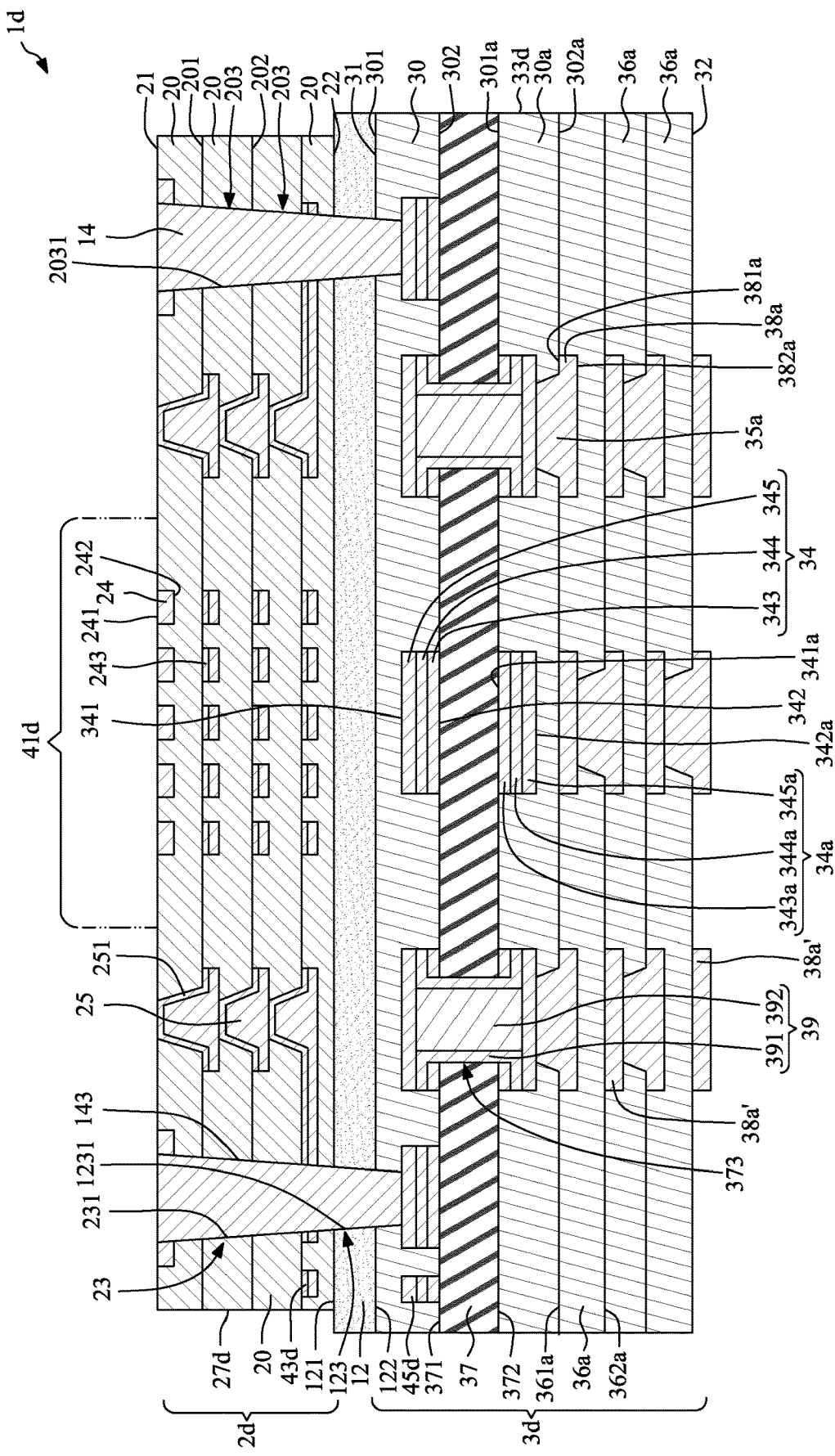
FIG. 5 illustrates a cross-sectional view of a wiring structure according to some embodiments of the present disclosure.

FIG. 5 illustrates a cross-sectional view of a wiring structure 1d according to some embodiments of the present disclosure. The wiring structure 1d is similar to the wiring structure 1c shown in FIG. 4, except for the structures of the upper conductive structure 2d and the lower conductive structure 3d. As shown in FIG. 5, the upper conductive structure 2d and the lower conductive structure 3d are both strip structures. Thus, the wiring structure 1d is a strip structure. In one embodiment, the lower conductive structure 3d may be a panel structure that carries a plurality of strip upper conductive structures 2d. Thus, the wiring structure 1d is a panel structure. That is, the upper conductive structure 2d has at least one chip bonding area 41d for receiving at least one semiconductor chip 42 (FIG. 6), and a length (e.g., 240 mm) of the upper conductive structure 2d is greater than a width (e.g., 95 mm) of the upper conductive structure 2d from a top view. Further, a length of the lower conductive structure 3d is greater than a width of the lower conductive structure 3d from a top view. In addition, a lateral peripheral surface 27d of the upper conductive structure 2d is not coplanar with a lateral peripheral surface 33d of the lower conductive structure 3d. In one embodiment, during the manufacturing process, the lower conductive structure 3d and the upper conductive structure 2d may be both known good strip structures. Alternatively, the upper conductive structure 2d may be a known good strip structure, and the lower conductive structure 3d may be a known good panel structure. As a result, the yield of the wiring structure 1d may be further improved.

As shown in FIG. 5, the upper conductive structure 2d has at least one fiducial mark 43d at a corner thereof, and the lower conductive structure 3d has at least one fiducial mark 4d at a corner thereof. The fiducial mark 43d of the upper conductive structure 2d is aligned with the fiducial mark 45d of the lower conductive structure 3d during a manufacturing process, so that the relative position of the upper conductive structure 2d and the lower conductive structure 3d are secured. In one embodiment, the fiducial mark 43d and the bottommost first circuit layer 24 may be at the same layer, and may be formed concurrently. Further, the fiducial mark 45d and the first upper circuit layer 34 may be at the same layer, and may be formed concurrently.

Figure 6:
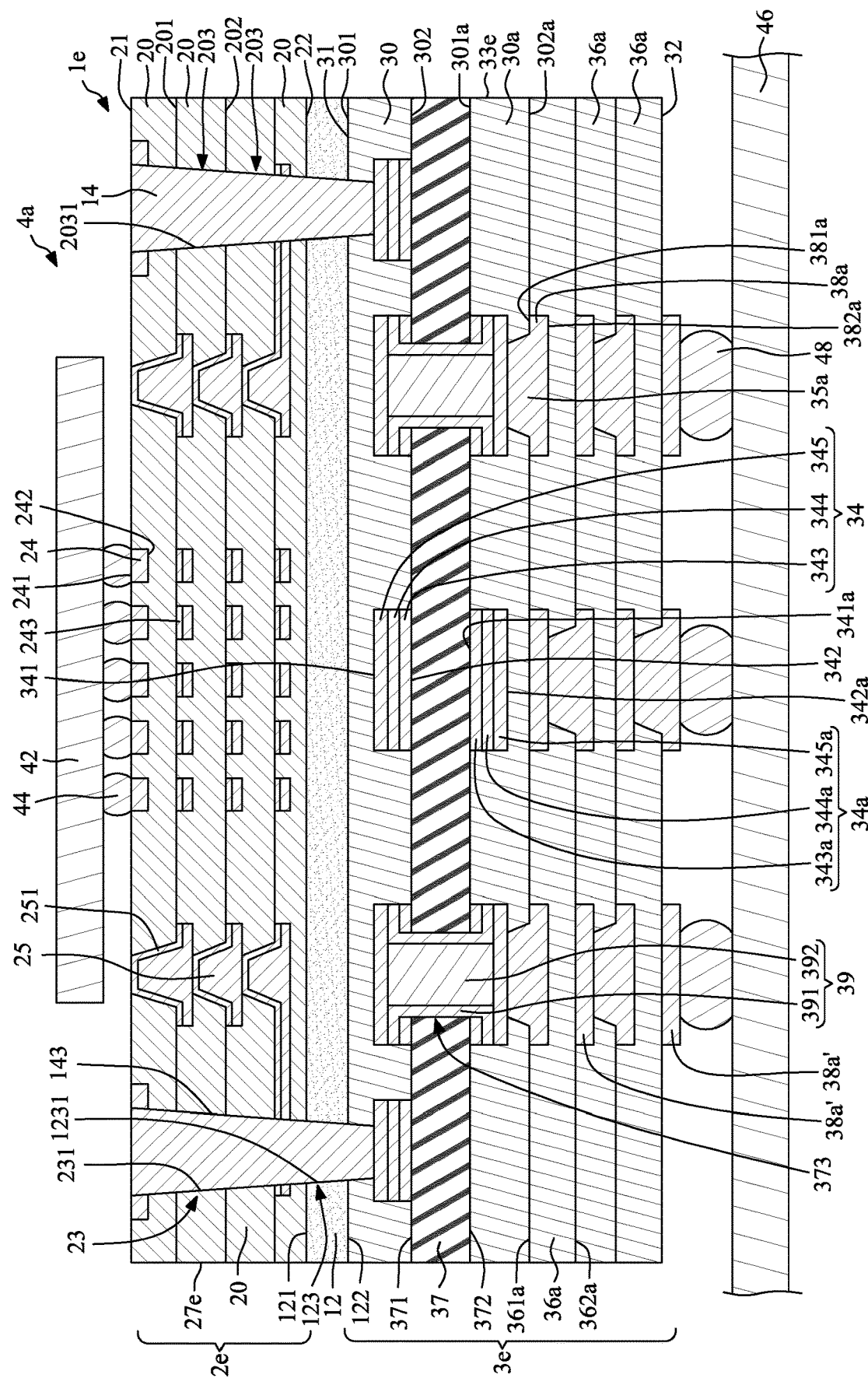
FIG. 6 illustrates a cross-sectional view of a bonding of a package structure and a substrate.

FIG. 6 illustrates a cross-sectional view of a bonding of a package structure 4a and a substrate 46. The package structure 4a includes a wiring structure 1e, a semiconductor chip 42, a plurality of first connecting elements 44 and a plurality of second connecting elements 48. The wiring structure 1e of FIG. 6 is similar to the wiring structure 1c shown in FIG. 4, except for the structures of the upper conductive structure 2e and the lower conductive structure 3e. The upper conductive structure 2e and the lower conductive structure 3e are both dice and may be singulated concurrently. Thus, the wiring structure 1e is a unit structure. That is, a lateral peripheral surface 27e of the upper conductive structure 2e, a lateral peripheral surface 33e of the lower conductive structure 3e and a lateral peripheral surface of the adhesion layer 12 are substantially coplanar with each other. The semiconductor chip 42 is electrically connected and bonded to the topmost first circuit layer 24 of the upper conductive structure 2e through the first connecting elements 44 (e.g., solders or bumps). The bottommost second upper circuit layer 38' of the lower conductive structure 3e is electrically connected and bonded to the substrate 46 (e.g., a mother board such as a PCB board) through the second connecting elements 48 (e.g., solders or bumps).

FIG. 7 through FIG. 44 illustrate a method for manufacturing a wiring structure according to some embodiments of the present disclosure. In some embodiments, the method is for manufacturing the wiring structure 1 shown in FIG. 1, and/or the package structure 4 shown in FIG. 3.

Figure 7:
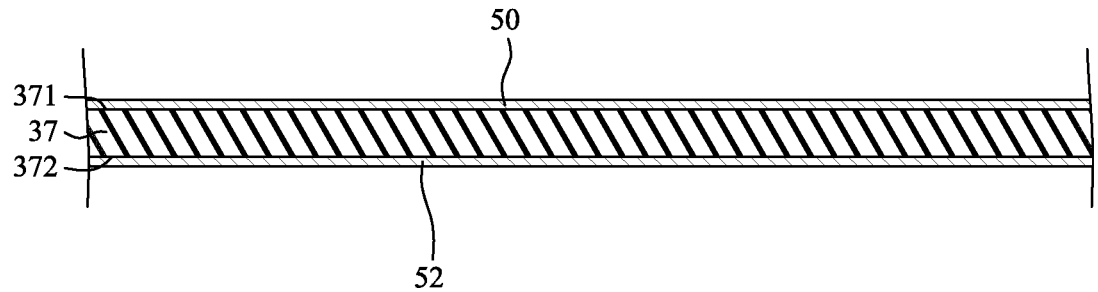
FIG. 7 illustrates one or more stages of an example of a method for manufacturing a wiring structure according to some embodiments of the present disclosure.

Referring to FIG. 7 through FIG. 26, a lower conductive structure 3 is provided. The lower conductive structure 3 is manufactured as follows. Referring to FIG. 7, a core portion 37 with a top copper foil 50 and a bottom copper foil 52 is provided. The core portion 37 may be in a wafer type, a panel type or a strip type. The core portion 37 has a top surface 371 and a bottom surface 372 opposite to the top surface 371. The top copper foil 50 is disposed on the top surface 371 of the core portion 37, and the bottom copper foil 52 is disposed on the bottom surface 372 of the core portion 37.

Figure 8:
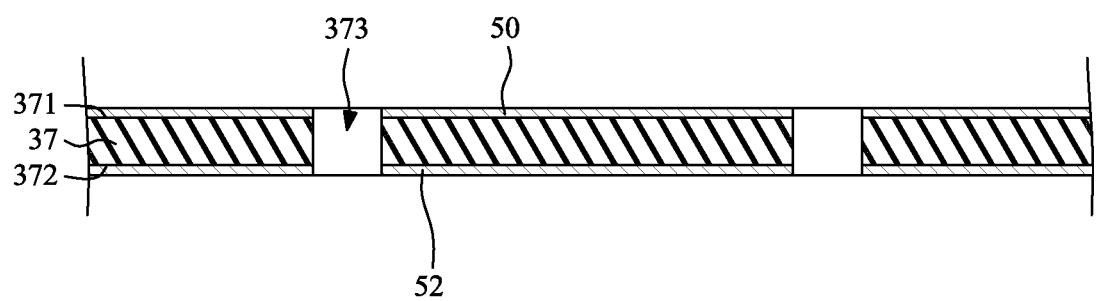
FIG. 8 illustrates one or more stages of an example of a method for manufacturing a wiring structure according to some embodiments of the present disclosure.

Referring to FIG. 8, a plurality of through holes 373 are formed to extend through the core portion 37, the top copper foil 50 and the bottom copper foil 52 by drilling technique or other suitable technique(s).

Figure 9:
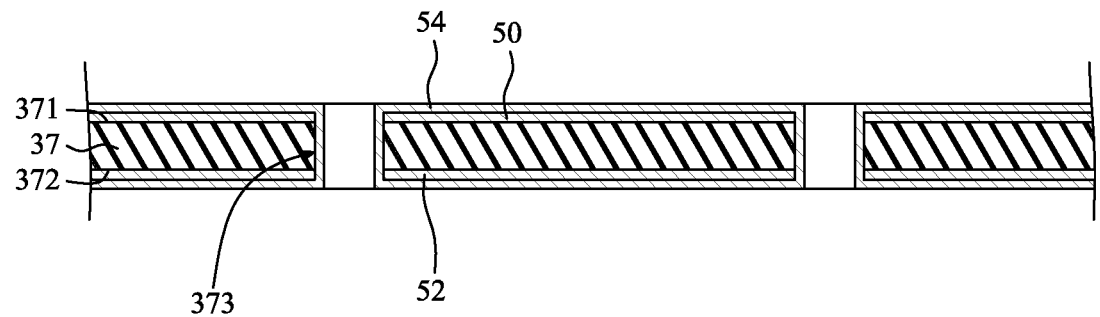
FIG. 9 illustrates one or more stages of an example of a method for manufacturing a wiring structure according to some embodiments of the present disclosure.

Referring to FIG. 9, a second metal layer 54 is formed or disposed on the top copper foil 50, the bottom copper foil 52 and the side walls of the through holes 373 by plating technique or other suitable technique(s). A portion of the second metal layer 54 on the side wall of the through hole 373 defines a central through hole.

Figure 10:
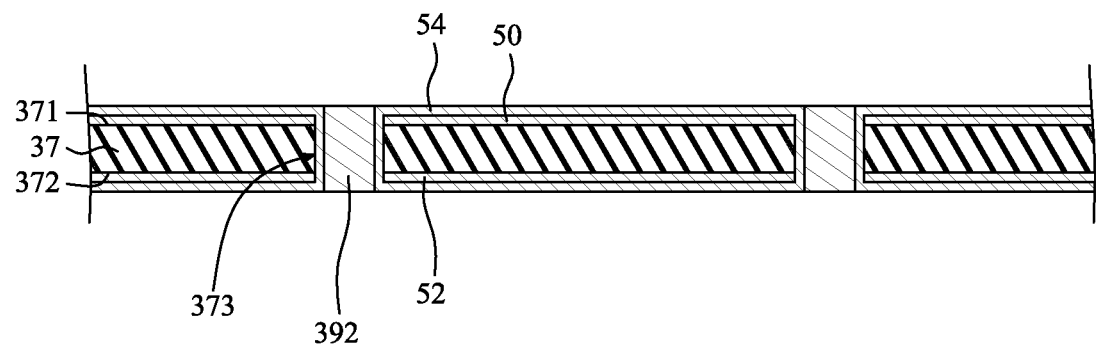
FIG. 10 illustrates one or more stages of an example of a method for manufacturing a wiring structure according to some embodiments of the present disclosure.

Referring to FIG. 10, an insulation material 392 fills the central through hole defined by the second metal layer 54.

Figure 11:
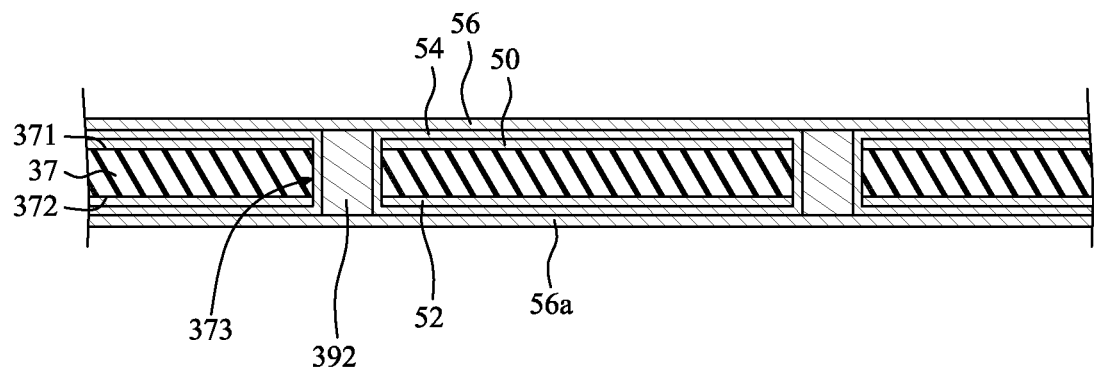
FIG. 11 illustrates one or more stages of an example of a method for manufacturing a wiring structure according to some embodiments of the present disclosure.

Referring to FIG. 11, a top third metal layer 56 and a bottom third metal layer 56a are formed or disposed on the second metal layer 54 by plating technique or other suitable technique(s). The third metal layers 56, 56a cover the insulation material 392.

Figure 12:
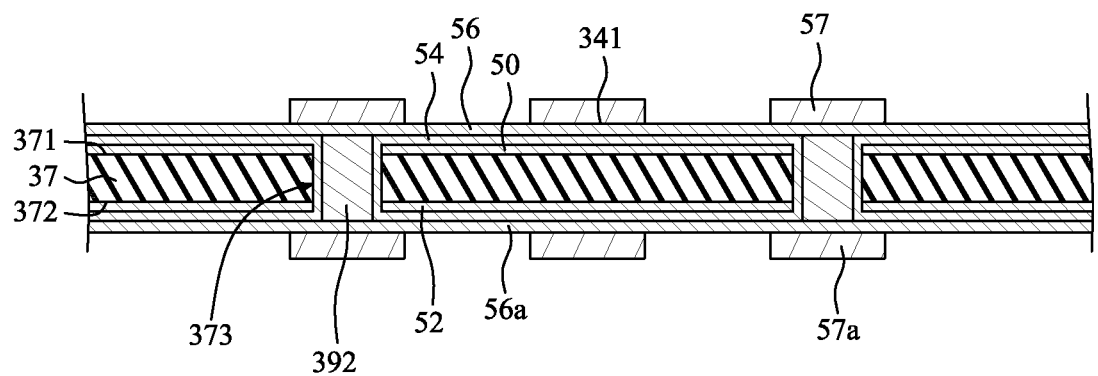
FIG. 12 illustrates one or more stages of an example of a method for manufacturing a wiring structure according to some embodiments of the present disclosure.

Referring to FIG. 12, a top photoresist layer 57 is formed or disposed on the top third metal layer 56, and a bottom photoresist layer 57a is formed or disposed on the bottom third metal layer 56a. Then, the photoresist layers 57, 57a are patterned by exposure and development.

Figure 13:
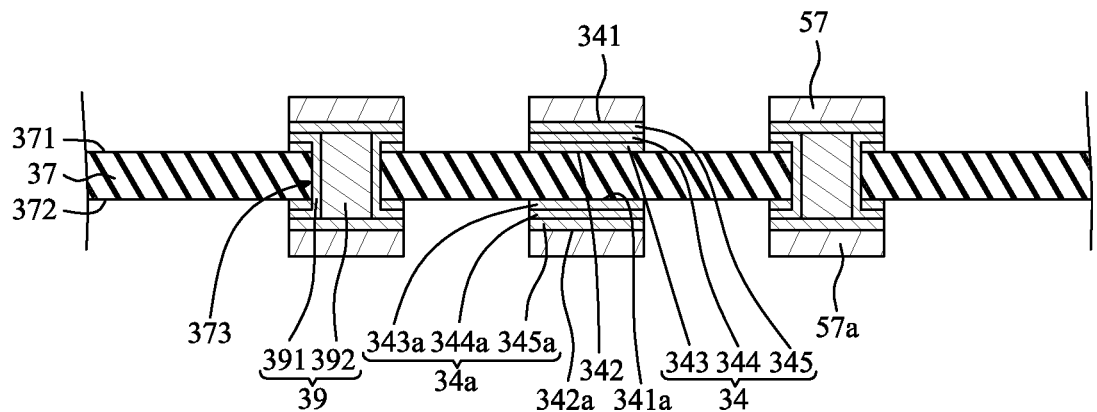
FIG. 13 illustrates one or more stages of an example of a method for manufacturing a wiring structure according to some embodiments of the present disclosure.

Referring to FIG. 13, the portions of the top copper foil 50, the second metal layer 54 and the top third metal layer 56 that are not covered by the top photoresist layer 57 is removed by etching technique or other suitable technique(s). The portions of the top copper foil 50, the second metal layer 54 and the top third metal layer 56 that are covered by the top photoresist layer 57 remain to form a first upper circuit layer 34. Meanwhile, the portions of the bottom copper foil 52, the second metal layer 54 and the bottom third metal layer 56a that are not covered by the bottom photoresist layer 57a is removed by etching technique or other suitable technique(s). The portions of the bottom copper foil 52, the second metal layer 54 and the bottom third metal layer 56a that are covered by the bottom photoresist layer 57a remain to form a first lower circuit layer 34a. Meanwhile, the portions of the second metal layer 54 and the insulation material 392 that are disposed in the through hole 373 form an interconnection via 39. As shown in FIG. 13, the first upper circuit layer 34 has a top surface 341 and a bottom surface 342 opposite to the top surface 341. In one embodiment, the first upper circuit layer 34 is formed or disposed on the top surface 371 of the core portion 37. The bottom surface 342 of the first upper circuit layer 34 may contact the top surface 371 of the core portion 37. In one embodiment, the first upper circuit layer 34 may include a first metal layer 343, a second metal layer 344 and a third metal layer 345. The first metal layer 343 is disposed on the top surface 371 of the core portion 37, and may be made from the top copper foil 50. The second metal layer 344 is disposed on the first metal layer 343, and may be a plated copper layer made from the second metal layer 54. The third metal layer 345 is disposed on the second metal layer 344, and may be a plated copper layer made from the top third metal layer 56.

The first lower circuit layer 34a has a top surface 341a and a bottom surface 342a opposite to the top surface 341a. In one embodiment, the first lower circuit layer 34a is formed or disposed on the bottom surface 372 of the core portion 37. The top surface 341a of the first lower circuit layer 34a may contact the bottom surface 372 of the core portion 37. In one embodiment, the first lower circuit layer 34a may include a first metal layer 343a, a second metal layer 344a and a third metal layer 345a. The first metal layer 343a is disposed on the bottom surface 372 of the core portion 37, and may be made from a bottom copper foil 52. The second metal layer 344a is disposed on the first metal layer 343a, and may be a plated copper layer made from the second metal layer 54. The third metal layer 345a is disposed on the second metal layer 344a, and may be a plated copper layer made from the bottom third metal layer 56a. The interconnection via 39 includes a base metal layer 391 made from the second metal layer 54 and an insulation material 392. In one embodiment, the interconnection via 39 may solely include a bulk metal material that fills the through hole 373. The interconnection via 39 electrically connects the first upper circuit layer 34 and the first lower circuit layer 34a.

Figure 14:
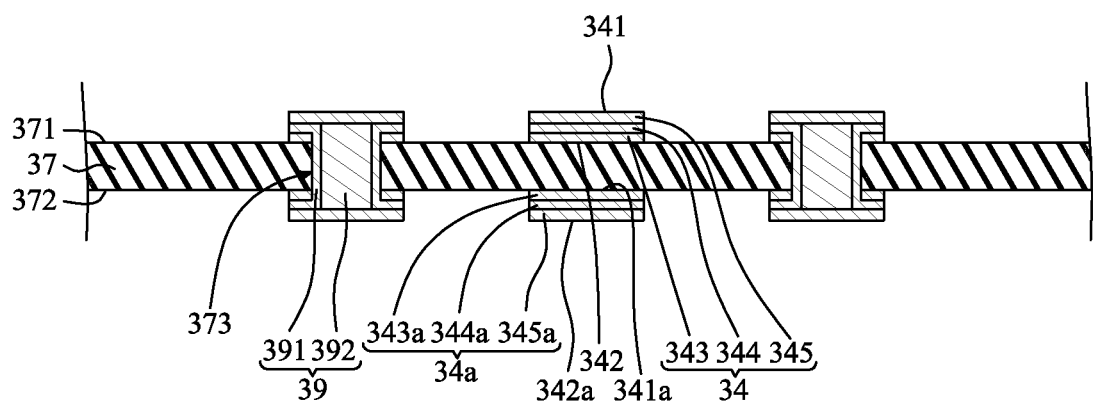
FIG. 14 illustrates one or more stages of an example of a method for manufacturing a wiring structure according to some embodiments of the present disclosure.

Referring to FIG. 14, the top photoresist layer 57 and the bottom photoresist layer 57a are removed by stripping technique or other suitable technique(s).

Figure 15:
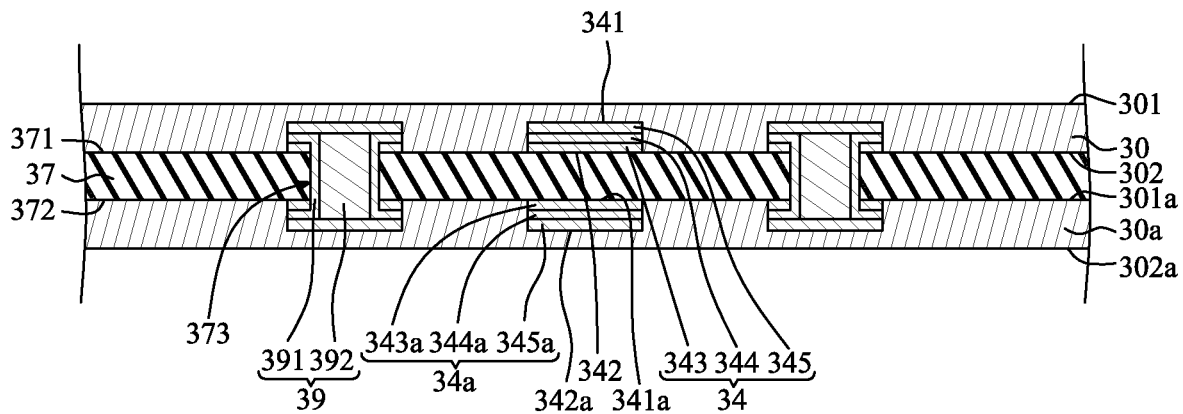
FIG. 15 illustrates one or more stages of an example of a method for manufacturing wiring structure according to some embodiments of the present disclosure.

Referring to FIG. 15, a first upper dielectric layer 30 is formed or disposed on the top surface 371 of the core portion 37 to cover the top surface 371 of the core portion 37 and the first upper circuit layer 34 by lamination technique or other suitable technique(s). Meanwhile, a first lower dielectric layer 30a is formed or disposed on the bottom surface 372 of the core portion 37 to cover the bottom surface 372 of the core portion 37 and the first lower circuit layer 34a by lamination technique or other suitable technique(s).

Figure 16:
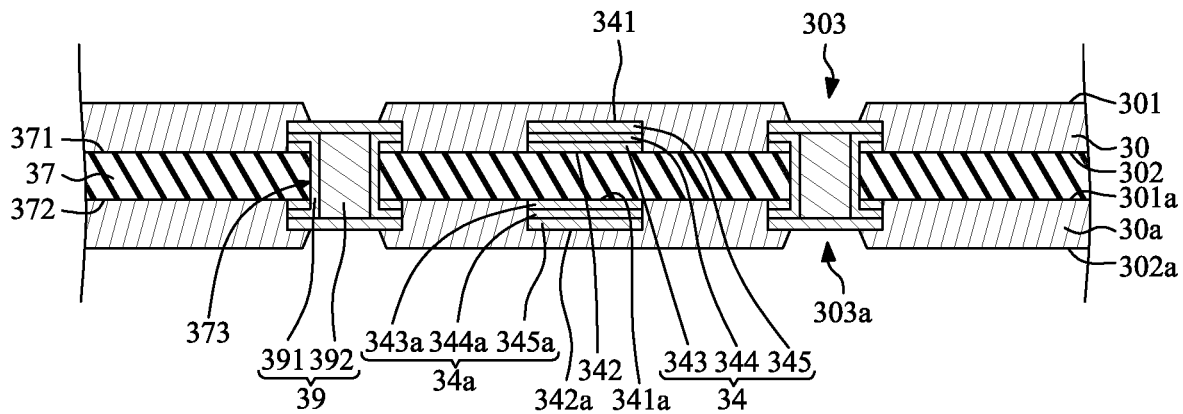
FIG. 16 illustrates one or more stages of an example of a method for manufacturing a wiring structure according to some embodiments of the present disclosure.

Referring to FIG. 16, at least one through hole 303 is formed to extend through the first upper dielectric layer 30 to expose a portion of the first upper circuit layer 34 by drilling technique or other suitable technique(s). Meanwhile, at least one through hole 303a is formed to extend through the first lower dielectric layer 30a to expose a portion of the first lower circuit layer 34a by drilling technique or other suitable technique(s).

Figure 17:
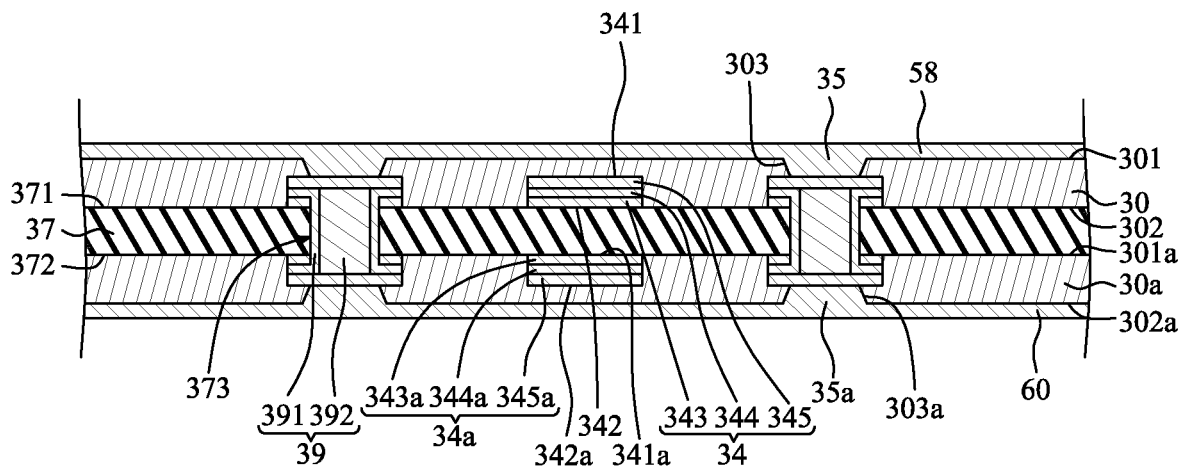
FIG. 17 illustrates one or more stages of an example of a method for manufacturing a wiring structure according to some embodiments of the present disclosure.

Referring to FIG. 17, a top metal layer 58 is formed on the first upper dielectric layer 30 and in the through hole 303 to form an upper via 35 by plating technique or other suitable technique(s). Meanwhile, a bottom metal layer 60 is formed on the first lower dielectric layer 30a and in the through hole 303a to form a lower via 35a by plating technique or other suitable technique(s). As shown in FIG. 17, the upper via 35 tapers downward, and the lower via 35a tapers upward.

Figure 18:
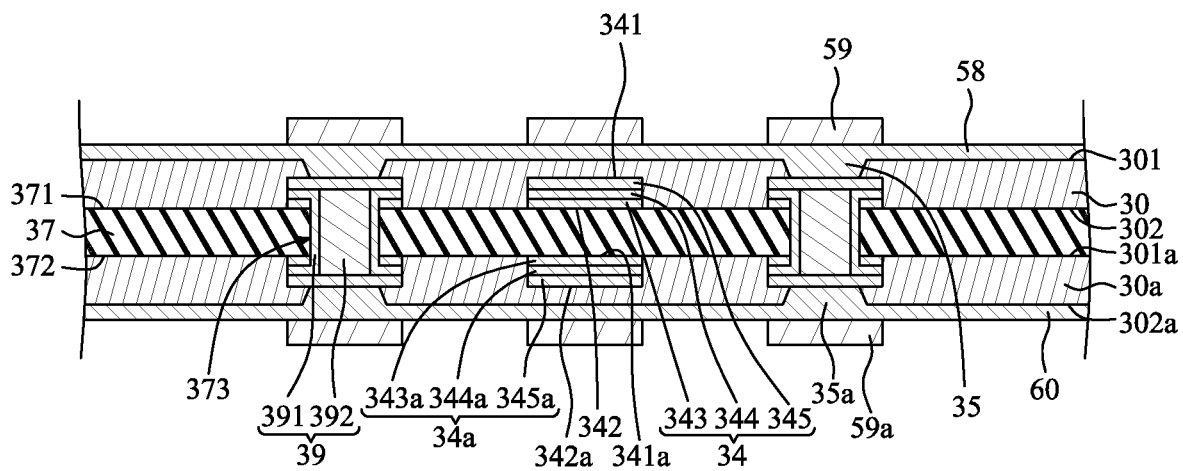
FIG. 18 illustrates one or more stages of an example of a method for manufacturing a wiring structure according to some embodiments of the present disclosure.

Referring to FIG. 18, a top photoresist layer 59 is formed or disposed on the top metal layer 58, and a bottom photoresist layer 59a is formed or disposed on the bottom metal layer 60. Then, the photoresist layers 59, 59a are patterned by exposure and development.

Figure 19:
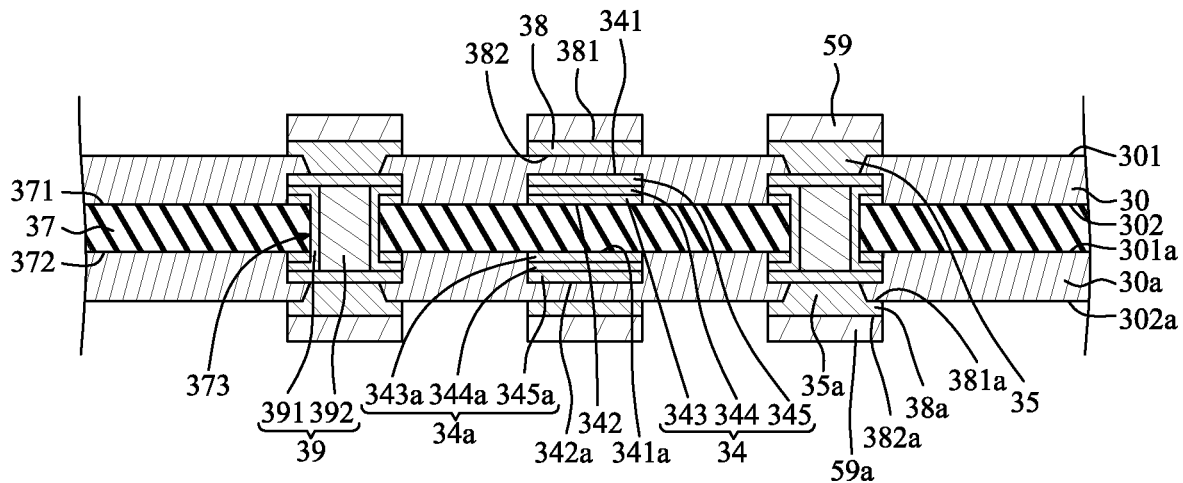
FIG. 19 illustrates one or more stages of an example of a method for manufacturing a wiring structure according to some embodiments of the present disclosure.

Referring to FIG. 19, the portions of the top metal layer 58 that are not covered by the top photoresist layer 59 is removed by etching technique or other suitable technique(s). The portions of the top metal layer 58 that are covered by the top photoresist layer 59 remain to form a second upper circuit layer 38. Meanwhile, the portions of the bottom metal layer 60 that are not covered by the bottom photoresist layer

59a is removed by etching technique or other suitable technique(s). The portions of the bottom metal layer 60 that are covered by the bottom photoresist layer 59a remain to form a second lower circuit layer 38a.

Figure 20:
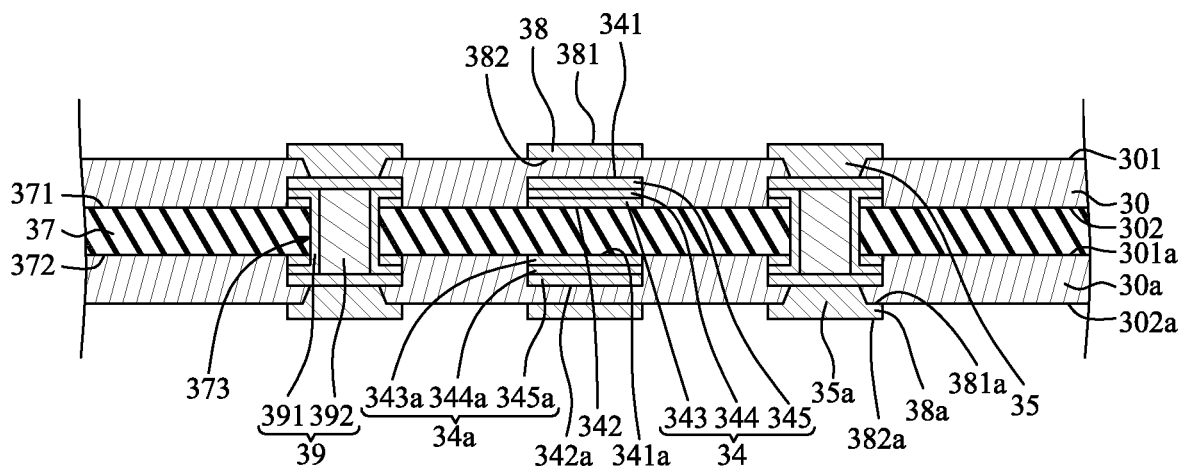
FIG. 20 illustrates one or more stages of an example of a method for manufacturing a wiring structure according to some embodiments of the present disclosure.

Referring to FIG. 20, the top photoresist layer 59 and the bottom photoresist layer 59a are removed by stripping technique or other suitable technique(s).

Figure 21:
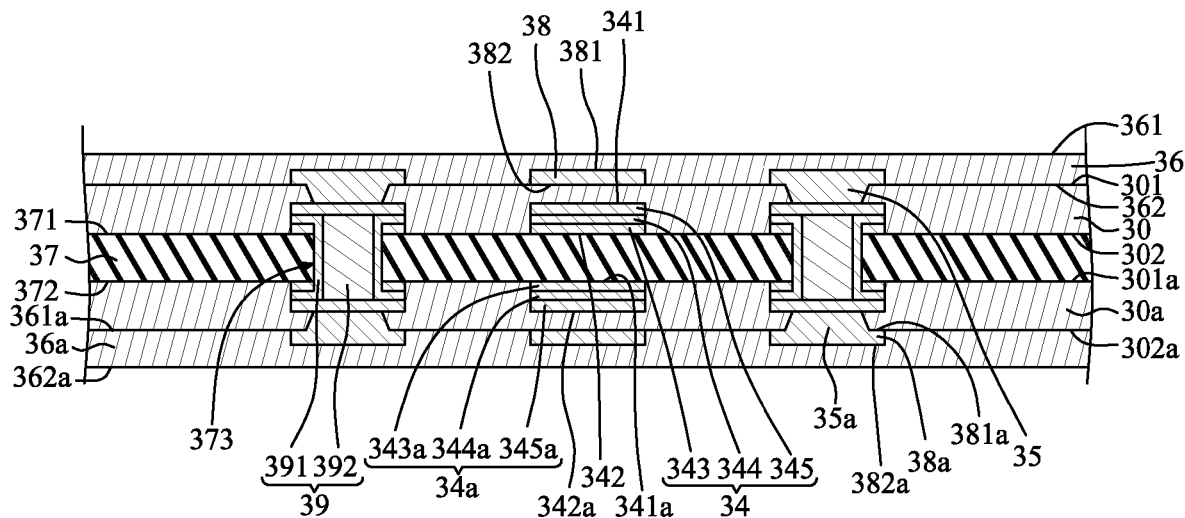
FIG. 21 illustrates one or more stages of an example of a method for manufacturing a wiring structure according to some embodiments of the present disclosure.

Referring to FIG. 21, a second upper dielectric layer 36 is formed or disposed on the top surface 301 of the first upper dielectric layer 30 to cover the top surface 301 of the first upper dielectric layer 30 and the second upper circuit layer 38 by lamination technique or other suitable technique(s). Meanwhile, a second lower dielectric layer 36a is formed or disposed on the bottom surface 302a of the first lower dielectric layer 30a to cover the bottom surface 302a of the first lower dielectric layer 30a and the second lower circuit layer 38a by lamination technique or other suitable technique(s).

Figure 22:
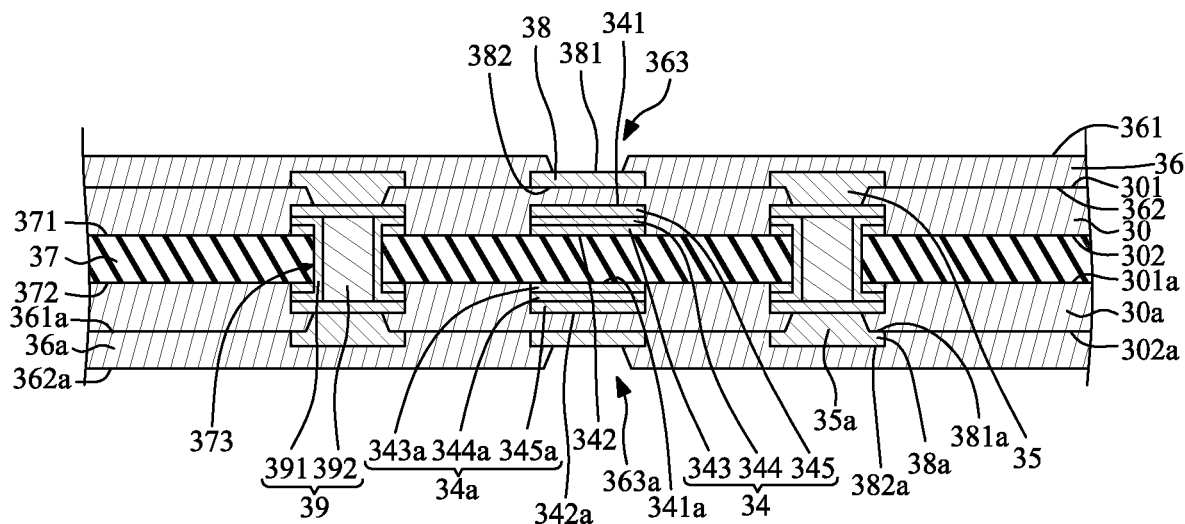
FIG. 22 illustrates one or more stages of an example of a method for manufacturing a wiring structure according to some embodiments of the present disclosure.

Referring to FIG. 22, at least one through hole 363 is formed to extend through the second upper dielectric layer 36 to expose a portion of the second upper circuit layer 38 by drilling technique or other suitable technique(s). Meanwhile, at least one through hole 363a is formed to extend through the second lower dielectric layer 36a to expose a portion of the second lower circuit layer 38a by drilling technique or other suitable technique(s).

Figure 23:
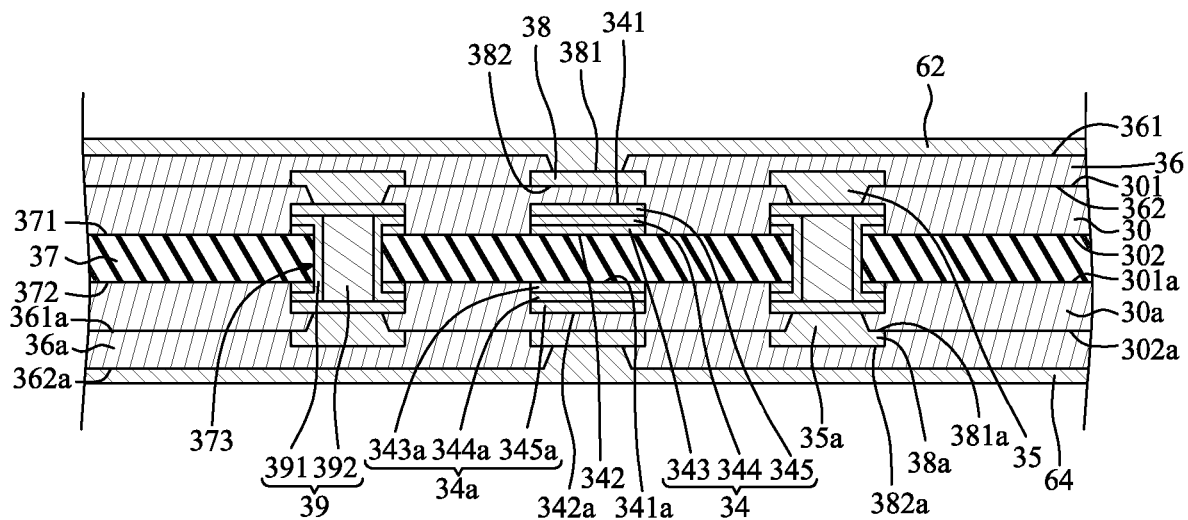
FIG. 23 illustrates one or more stages of an example of a method for manufacturing a wiring structure according to some embodiments of the present disclosure.

Referring to FIG. 23, a top metal layer 62 is formed on the second upper dielectric layer 36 and in the through hole 363 to form an upper via 35 by plating technique or other suitable technique(s). Meanwhile, a bottom metal layer 64 is formed on the second lower dielectric layer 36a and in the through hole 363a to form a lower via 35a by plating technique or other suitable technique(s).

Figure 24:
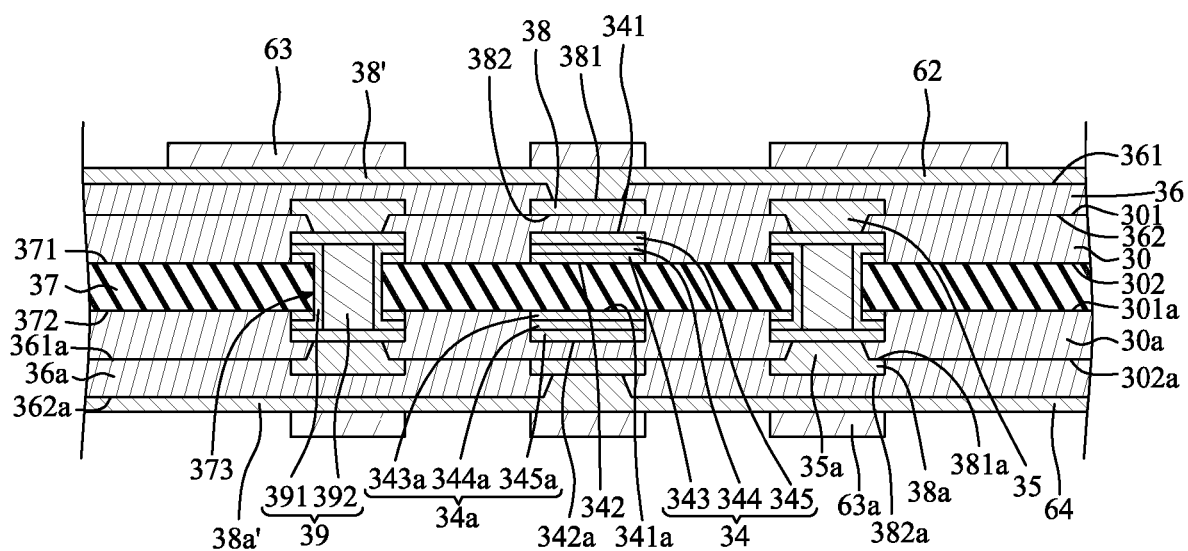
FIG. 24 illustrates one or more stages of an example of a method for manufacturing a wiring structure according to some embodiments of the present disclosure.

Referring to FIG. 24, a top photoresist layer 63 is formed or disposed on the top metal layer 62, and a bottom photoresist layer 63a is formed or disposed on the bottom metal layer 64. Then, the photoresist layers 63, 63a are patterned by exposure and development.

Figure 25:
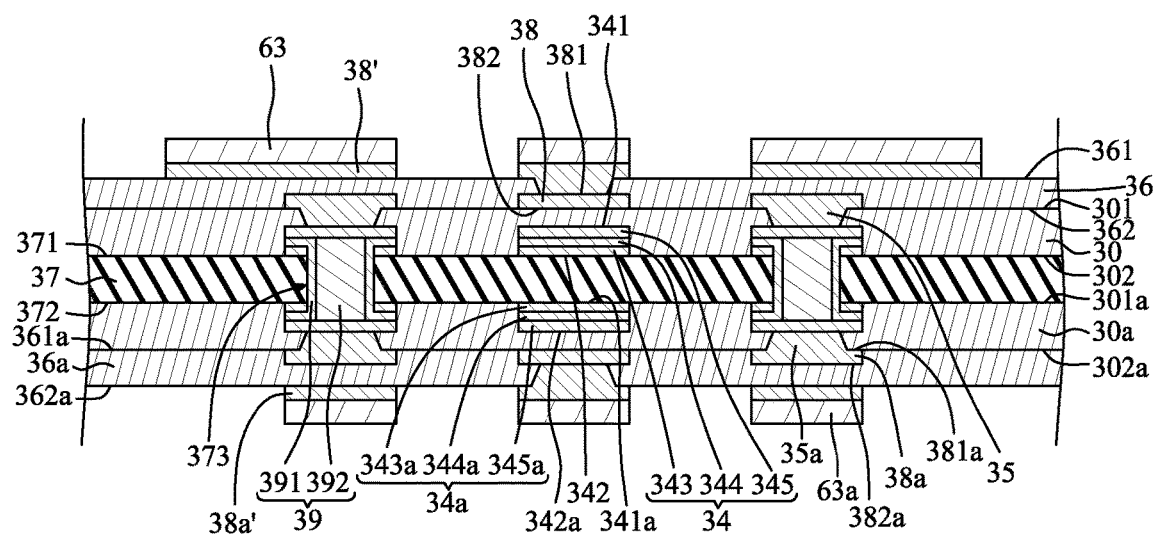
FIG. 25 illustrates one or more stages of an example of a method for manufacturing a wiring structure according to some embodiments of the present disclosure.

Referring to FIG. 25, the portions of the top metal layer 62 that are not covered by the top photoresist layer 63 is removed by etching technique or other suitable technique(s). The portions of the top metal layer 62 that are covered by the top photoresist layer 63 remain to form a second upper circuit layer 38'. Meanwhile, the portions of the bottom metal layer 64 that are not covered by the bottom photoresist layer 63a is removed by etching technique or other suitable technique(s). The portions of the bottom metal layer 64 that are covered by the bottom photoresist layer 63a remain to form a second lower circuit layer 38a'.

Figure 26:
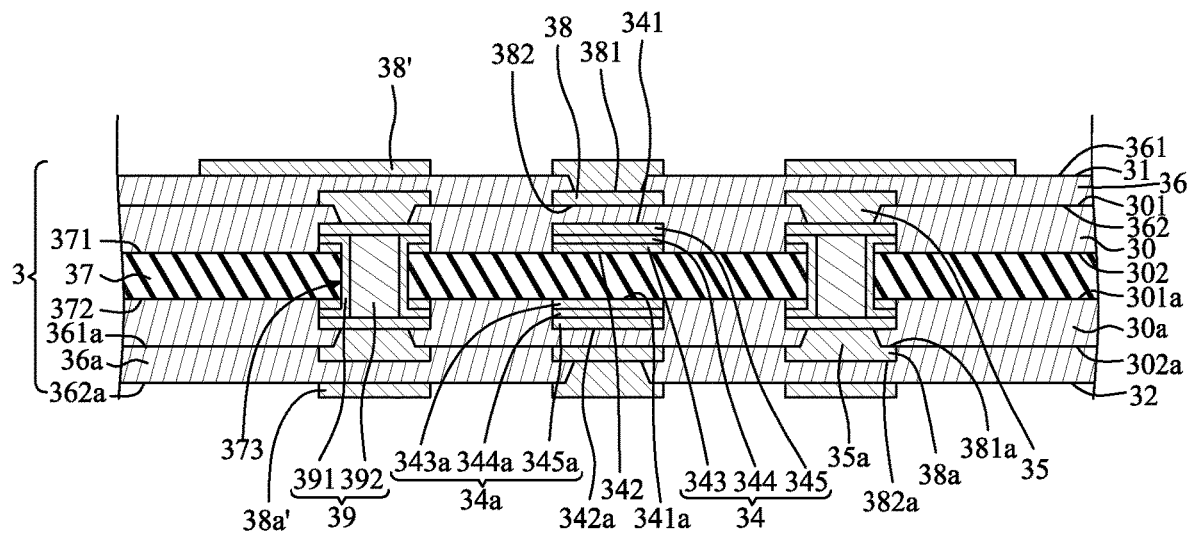
FIG. 26 illustrates one or more stages of an example of a method for manufacturing a wiring structure according to some embodiments of the present disclosure.

Referring to FIG. 26, the top photoresist layer 63 and the bottom photoresist layer 63a are removed by stripping technique or other suitable technique(s). Meanwhile, the lower conductive structure 3 is formed, and the dielectric layers (including, the first upper dielectric layer 30, the second upper dielectric layer 36, the first lower dielectric layer 30a and the second lower dielectric layer 36a) are cured. Then, the electrical property (such as open circuit/short circuit) of the lower conductive structure 3 is tested.

Figure 27:
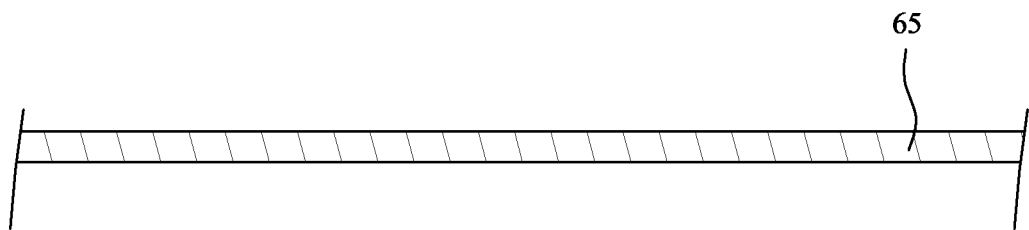
FIG. 27 illustrates one or more stages of an example of a method for manufacturing a wiring structure according to some embodiments of the present disclosure.

Referring to FIG. 27 through FIG. 37, an upper conductive structure 2 is provided. The upper conductive structure 2 is manufactured as follows. Referring to FIG. 27, a carrier 65 is provided. The carrier 65 may be a glass carrier, and may be in a wafer type, a panel type or a strip type.

Figure 28:
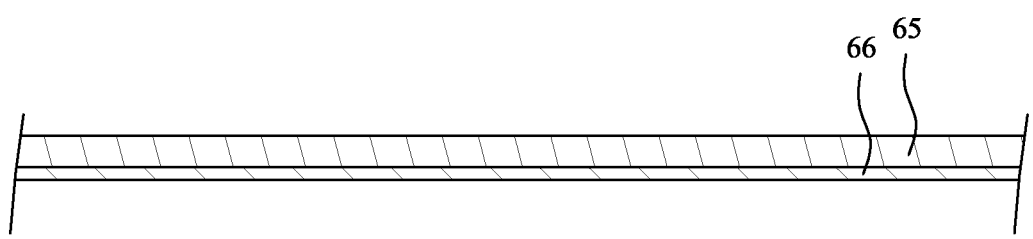
FIG. 28 illustrates one or more stages of an example of a method for manufacturing a wiring structure according to some embodiments of the present disclosure.

Referring to FIG. 28, a release layer 66 is coated on the bottom surface of the carrier 65.

Figure 29:
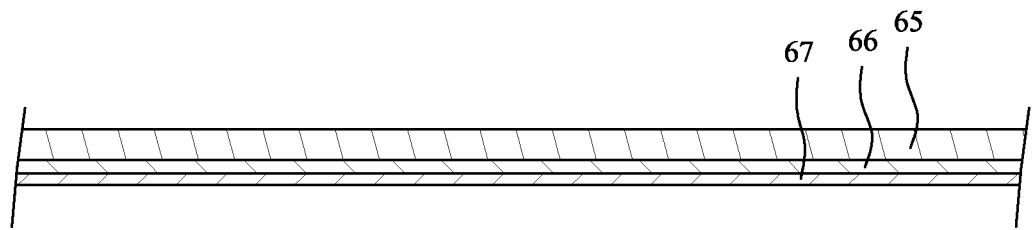
FIG. 29 illustrates one or more stages of an example of a method for manufacturing wiring structure according to some embodiments of the present disclosure.

Referring to FIG. 29, a conductive layer 67 (e.g., a seed layer) is formed or disposed on the release layer 66 by physical vapor deposition (PVD) technique or other suitable technique(s).

Figure 30:
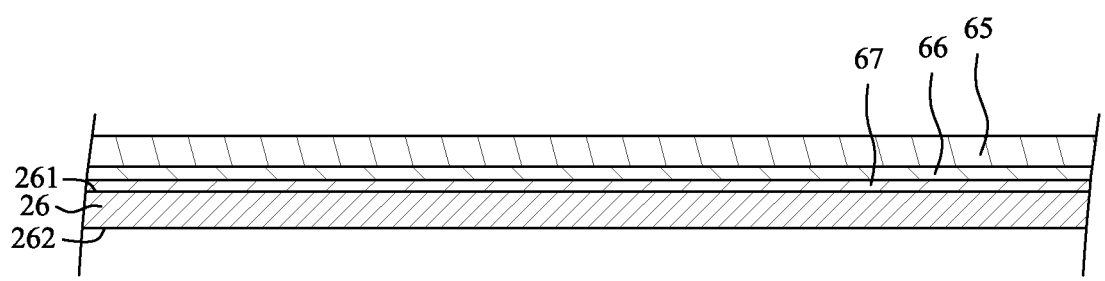
FIG. 30 illustrates one or more stages of an example of a method for manufacturing a wiring structure according to some embodiments of the present disclosure.

Referring to FIG. 30, a second dielectric layer 26 is formed on the conductive layer 67 by coating technique or other suitable technique(s).

Figure 31:
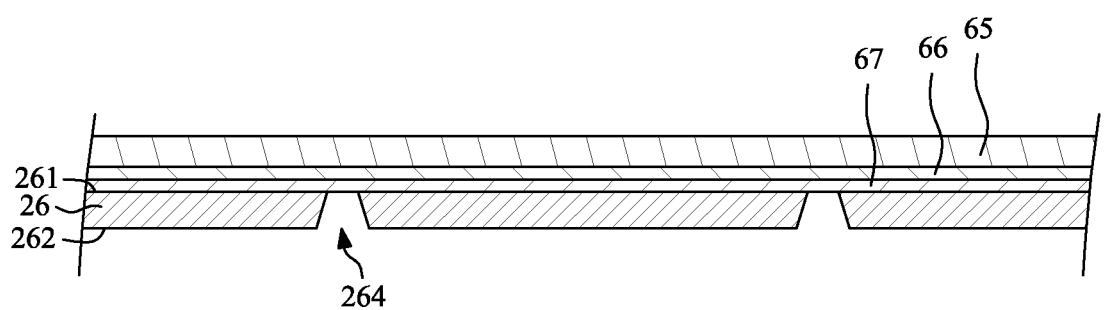
FIG. 31 illustrates one or more stages of an example of a method for manufacturing a wiring structure according to some embodiments of the present disclosure.

Referring to FIG. 31, at least one through hole 264 is formed to extend through the second dielectric layer 26 to expose a portion of the conductive layer 67 by exposure and development technique or other suitable technique(s).

Figure 32:
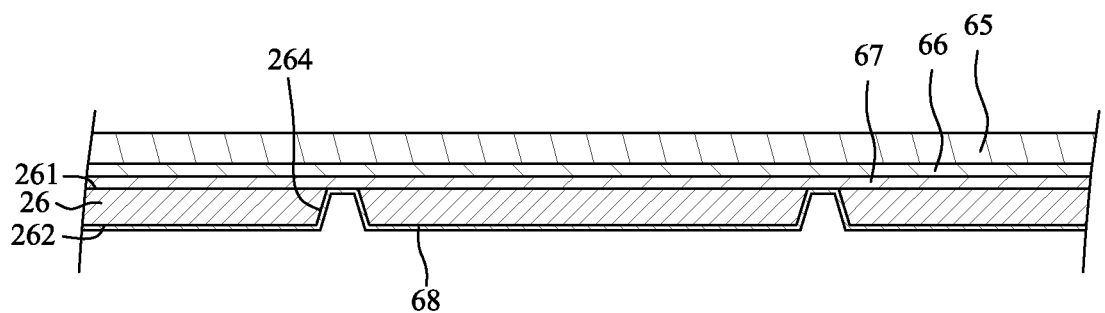
FIG. 32 illustrates one or more stages of an example of a method for manufacturing a wiring structure according to some embodiments of the present disclosure.

Referring to FIG. 32, a seed layer 68 is formed on the bottom surface 262 of the second dielectric layer 26 and in the through hole 264 by physical vapor deposition (PVD) technique or other suitable technique(s).

Figure 33:
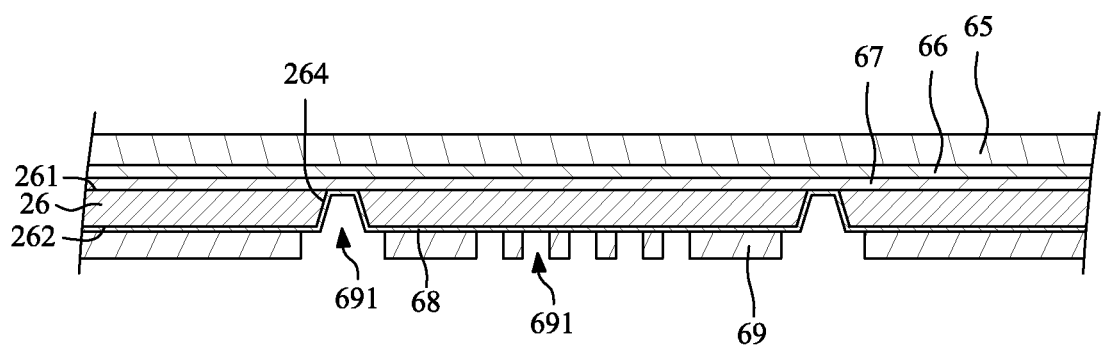
FIG. 33 illustrates one or more stages of an example of a method for manufacturing a wiring structure according to some embodiments of the present disclosure.

Referring to FIG. 33, a photoresist layer 69 is formed on the seed layer 68. Then, the photoresist layer 69 is patterned to expose portions of the seed layer 68 by exposure and development technique or other suitable technique(s). The photoresist layer 69 defines a plurality of openings 691. Some opening 691 of the photoresist layer 69 corresponds to the through hole 264 of the second dielectric layer 26.

Figure 34:
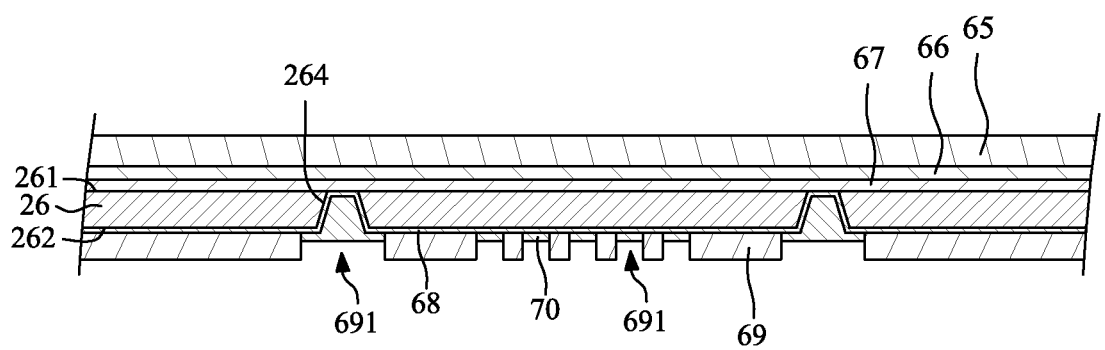
FIG. 34 illustrates one or more stages of an example of a method for manufacturing a wiring structure according to some embodiments of the present disclosure.

Referring to FIG. 34, a conductive metal material 70 is formed in the openings 691 of the photoresist layer 69 and on the seed layer 68 by plating technique or other suitable technique(s).

Figure 35:
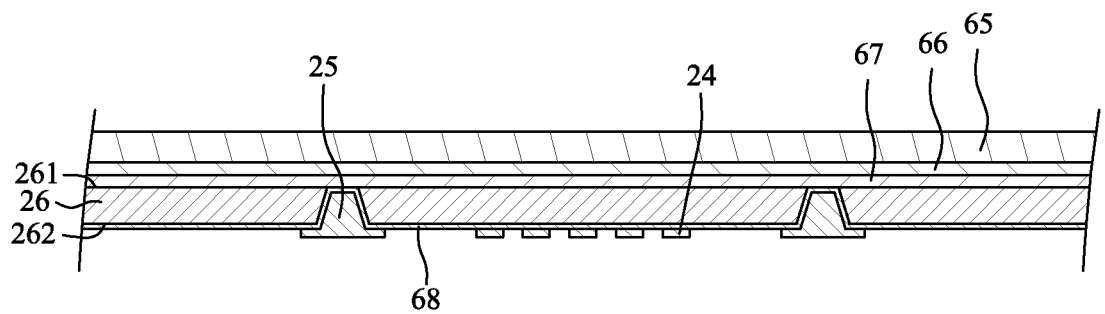
FIG. 35 illustrates one or more stages of an example of a method for manufacturing a wiring structure according to some embodiments of the present disclosure.

Referring to FIG. 35, the photoresist layer 69 is removed by stripping technique or other suitable technique(s).

Figure 36:
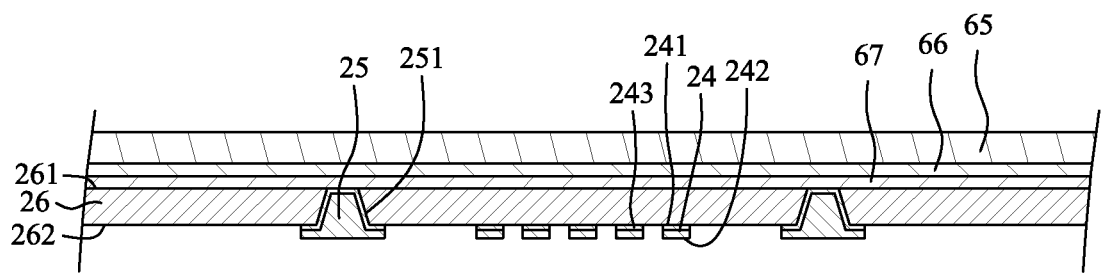
FIG. 36 illustrates one or more stages of an example of a method for manufacturing a wiring structure according to some embodiments of the present disclosure.

Referring to FIG. 36, portions of the seed layer 68 that are not covered by the conductive metal material 70 is removed by etching technique or other suitable technique(s). Meanwhile, a first circuit layer 24 and at least one inner via 25 are formed. The first circuit layer 24 may be a fan-out circuit layer, and an L/S of the first circuit layers 24 may be less than or equal to 2 μm/2 μm, or less than or equal to 1.8 μm/1.8 μm. The first circuit layer 24 is disposed on the bottom surface 262 of the second dielectric layer 26. In one embodiment, the first circuit layer 24 may include a seed layer 243 made from the seed layer 68 and a conductive metal material disposed on the seed layer 243. The inner via 25 is disposed in the through hole 264 of the second dielectric layer 26. In one embodiment, the inner via 25 may include a seed layer 251 and a conductive metal material disposed on the seed layer 251. The inner via 25 tapers upward.

Figure 37:
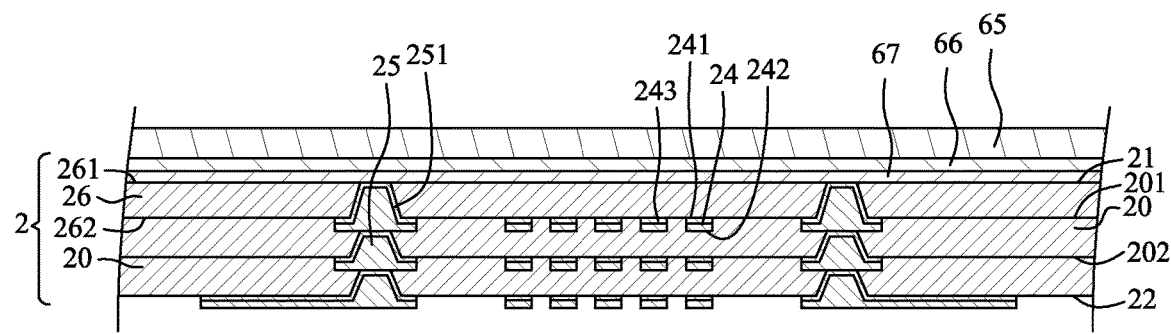
FIG. 37 illustrates one or more stages of an example of a method for manufacturing a wiring structure according to some embodiments of the present disclosure.

Referring to FIG. 37, a plurality of first dielectric layers 20 and a plurality of first circuit layers 24 are formed by repeating the stages of FIG. 30 to FIG. 36. In one embodiment, the first circuit layer 24 is embedded in the first dielectric layer 20, and the top surface 241 of the first circuit layer 24 may be substantially coplanar with the top surface 201 of the first dielectric layer 20. Meanwhile, the upper conductive structure 2 is formed, and the dielectric layers (including, the first dielectric layers 20 and the second dielectric layer 26) are cured. Then, the electrical property (such as open circuit/short circuit) of the upper conductive structure 2 is tested.

Figure 38:
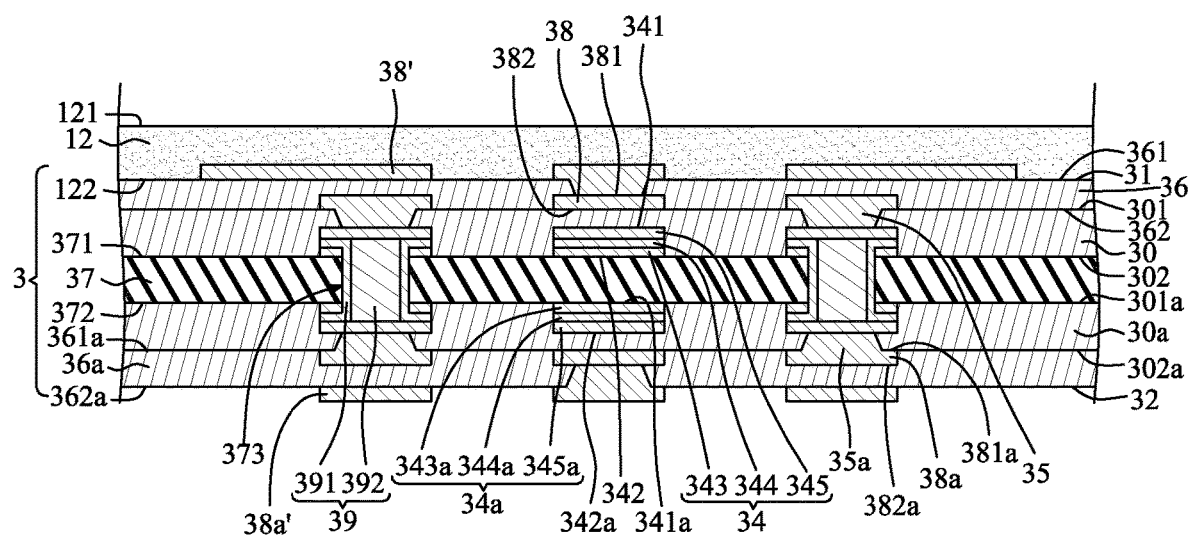
FIG. 38 illustrates one or more stages of an example of a method for manufacturing a wiring structure according to some embodiments of the present disclosure.

Referring to FIG. 38, an adhesion layer 12 is formed or applied on the top surface 31 of the lower conductive structure 3.

Figure 39:
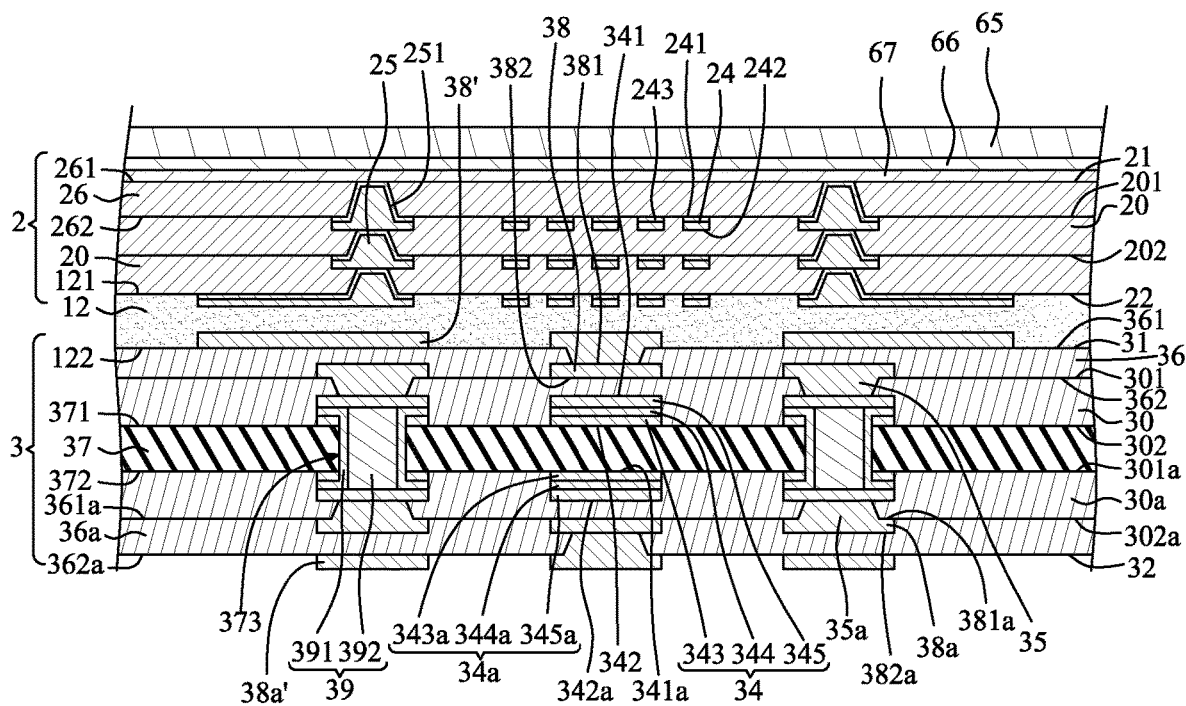
FIG. 39 illustrates one or more stages of an example of a method for manufacturing a wiring structure according to some embodiments of the present disclosure.

Referring to FIG. 39, the upper conductive structure 2 is attached to the lower conductive structure 3 through the adhesion layer 12. In one embodiment, known good upper conductive structure 2 is attached to known good lower conductive structure 3. Then, the adhesion layer 12 is cured. In one embodiment, the upper conductive structure 2 may be pressed to the lower conductive structure 3. Thus, the thickness of the adhesion layer 12 is determined by the gap between the upper conductive structure 2 and the lower conductive structure 3. The top surface 121 of the adhesion layer 12 may contact the bottom surface 22 of the upper conductive structure 2 (that is, the bottom surface 22 of the upper conductive structure 2 is attached to the top surface 121 of the adhesion layer 12), and the bottom surface 122 of the adhesion layer 12 may contact the top surface 31 of the lower conductive structure 3. Thus, the bottommost first circuit layer 24 of the upper conductive structure 2 and the second upper circuit layer 38' of the lower conductive structure 3 are embedded in the adhesion layer 12. In one embodiment, a bonding force between two dielectric layers (e.g., two first dielectric layers 20) of the upper conductive structure 2 is greater than a bonding force between a dielectric layer (e.g., the bottommost first dielectric layers 20) of the upper conductive structure 2 and the adhesion layer 12. A surface roughness of a boundary between two dielectric layers (e.g., two first dielectric layers 20) of the upper conductive structure 2 is greater than a surface roughness of a boundary between a dielectric layer (e.g., the bottommost first dielectric layers 20) of the upper conductive structure 2 and the adhesion layer 12.

Figure 40:
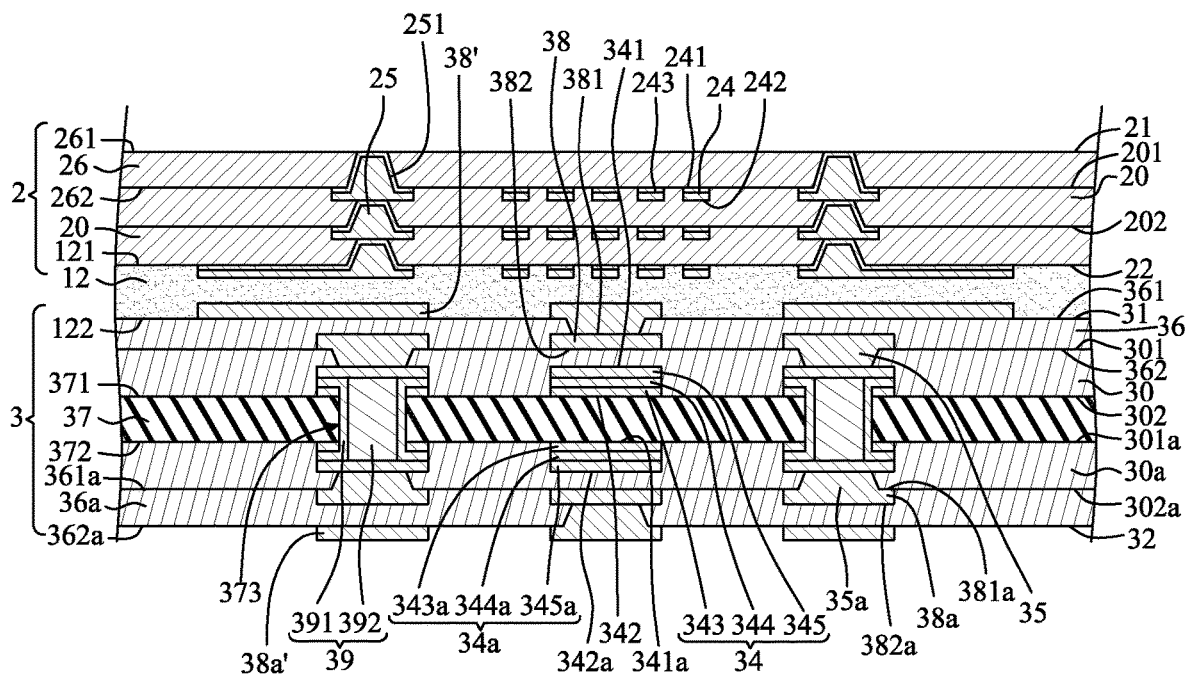
FIG. 40 illustrates one or more stages of an example of a method for manufacturing wiring structure according to some embodiments of the present disclosure.

Referring to FIG. 40, the carrier 65, the release layer 66 and the conductive layer 67 are removed so as to expose a portion of the inner via 25.

Figure 41:
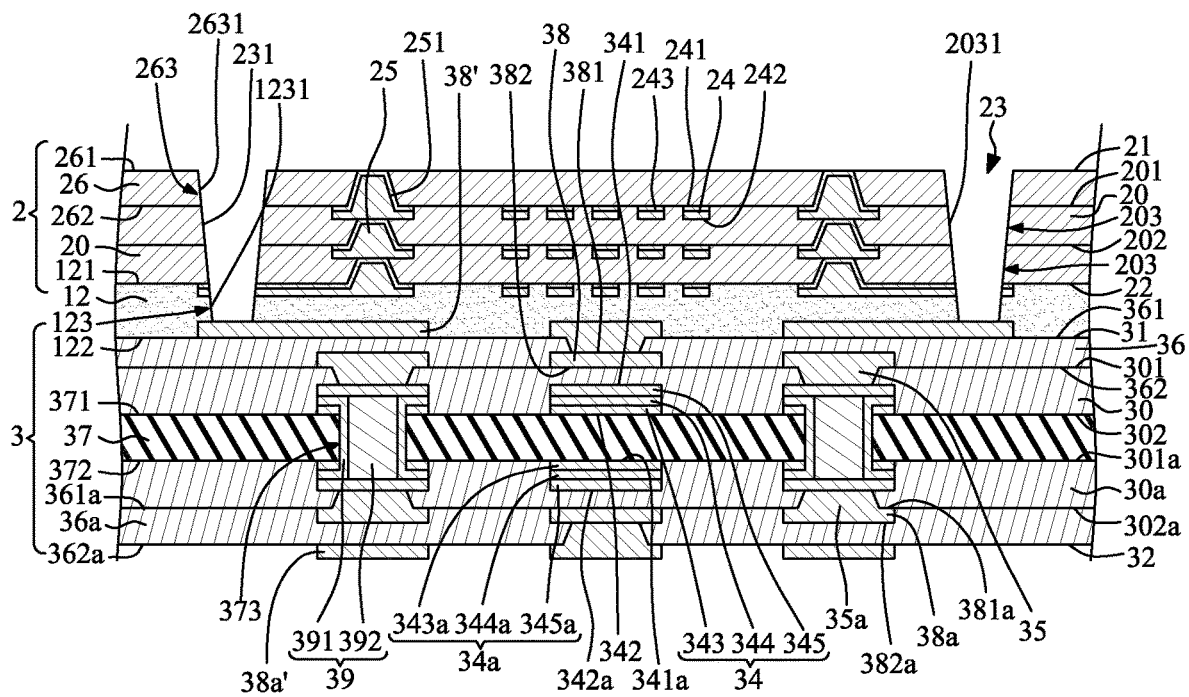
FIG. 41 illustrates one or more stages of an example of a method for manufacturing a wiring structure according to some embodiments of the present disclosure.

Referring to FIG. 41, at least one through hole 23 is formed to extend through at least a portion of the upper conductive structure 2 and the adhesion layer 12 by drilling to exposes a circuit layer (e.g., second upper circuit layers 38') of the lower conductive structure 3. The through hole 23 may include a through hole 263 of the second dielectric layer 26, a plurality of through holes 203 of the first dielectric layers 20 and a through hole 123 of the adhesion layer 12. In one embodiment, the through hole 23 extends through the bottommost first circuit layer 24 of the upper conductive structure 2 and stops on a topmost circuit layer (e.g., the second upper circuit layer 38') of the lower conductive structure 3. That is, the through hole 23 does not extend through the topmost circuit layer (e.g., the second upper circuit layer 38') of the lower conductive structure 3. The through hole 23 may expose a portion of the topmost circuit layer (e.g., the top surface of the second upper circuit layer 38') of the lower conductive structure 3. As shown in FIG. 41, the through hole 23 tapers downward, that is, a size of a top portion of the through hole 23 is greater than a size of a bottom portion of the through hole 23. In addition, the inner surface 1231 of the through hole 123 of the adhesion layer 12 is coplanar with or aligned with the inner surfaces 2031 of the through holes 203 of the first dielectric layers 20 and the inner surface 2631 of the through hole 263 of the second dielectric layer 26. Thus, cross-sectional views of one side of the through hole 123 of the adhesion layer 12, the inner surfaces 2031 of the through holes 203 of the first dielectric layers 20 and the inner surface 2631 of the through hole 263 of the second dielectric layer 26 are segments of a substantially straight line. That is, cross-sectional views of one side of the inner surface 1231 of the through hole 123 of the adhesion layer 12, the inner surfaces 2031 of the through holes 203 of the first dielectric layers 20 and the inner surface 2631 of the through hole 263 of the second dielectric layer 26 may extend along the same substantially straight line. That is, the inner surface of the single through hole 23 may be a substantially smooth or continuous surface. The single through hole 23 tapers downward. A maximum width of the single through hole 23 may be about 25 μm to 60 μm.

Figure 42:
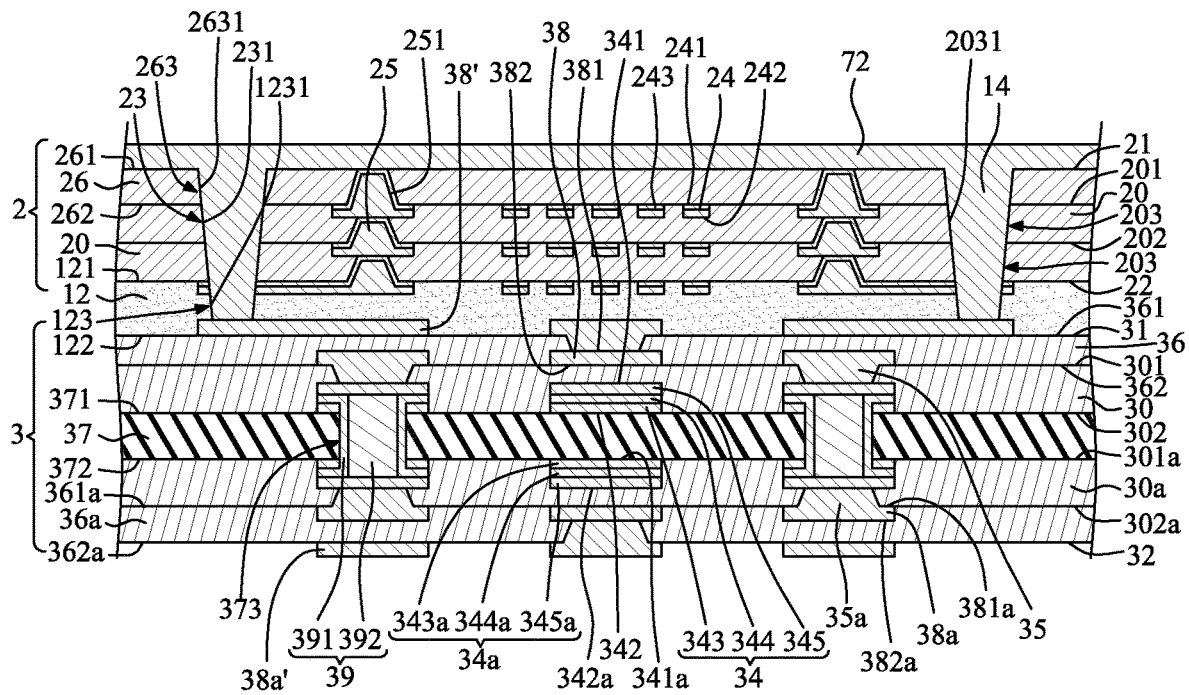
FIG. 42 illustrates one or more stages of an example of a method for manufacturing a wiring structure according to some embodiments of the present disclosure.

Referring to FIG. 42, a metal layer 72 is formed on the to surface 21 of the upper conductive structure 2 and in the through hole 23 to form at least one outer via 14 in the through hole 23 by plating technique or other suitable technique(s).

Figure 43:
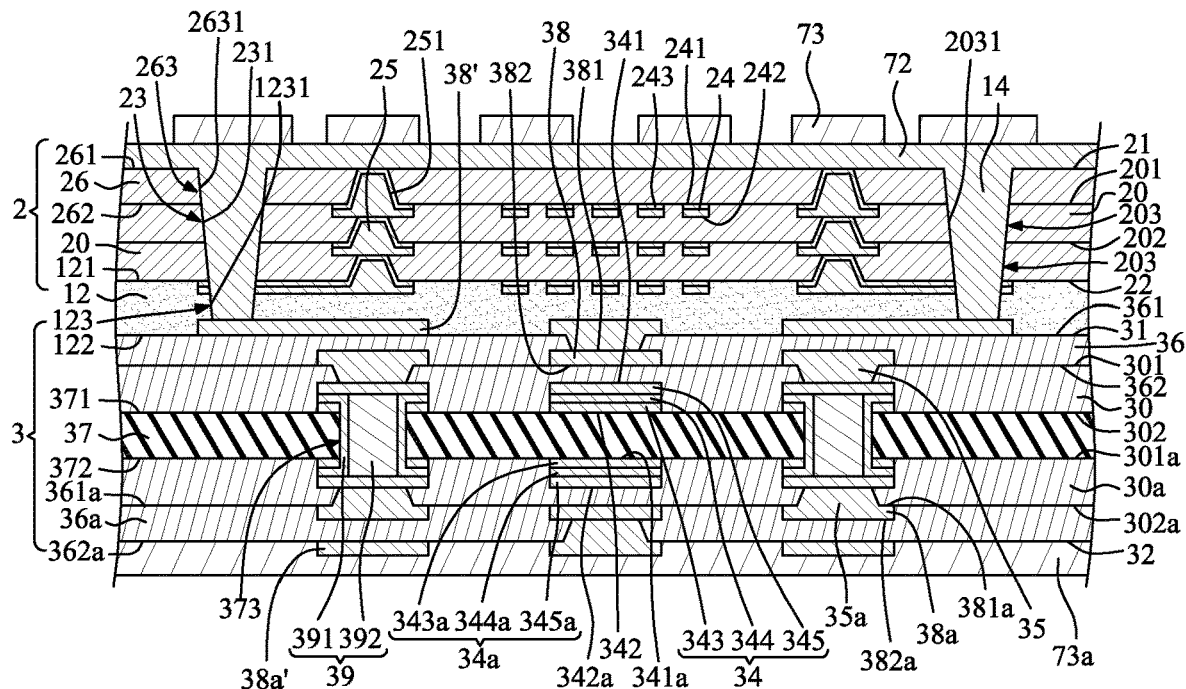
FIG. 43 illustrates one or more stages of an example of a method for manufacturing a wiring structure according to some embodiments of the present disclosure.

Referring to FIG. 43, a top photoresist layer 73 is formed or disposed on the metal layer 72, and a bottom photoresist layer 73a is formed or disposed on the bottom surface 32 of the lower conductive structure 3. Then, the top photoresist layer 73 is patterned by exposure and development technique or other suitable technique(s).

Figure 44:
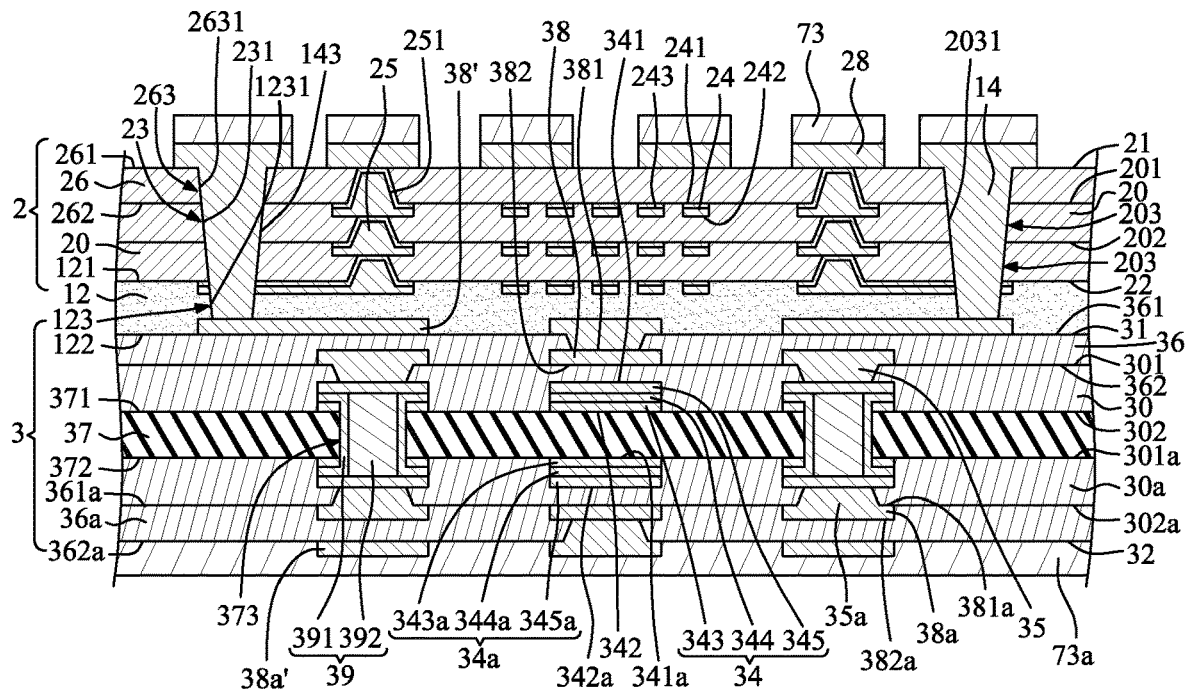
FIG. 44 illustrates one or more stages of an example of a method for manufacturing a wiring structure according to some embodiments of the present disclosure.

Referring to FIG. 44, the portions of the metal layer 72 that are not covered by the top photoresist layer 73 is removed by etching technique or other suitable technique(s). The portions of the metal layer 72 that are covered by the top photoresist layer 73 remain to form a second circuit layer 28. Then, the top photoresist layer 73 and the bottom photoresist layer 73a are removed by stripping technique or other suitable technique(s), so as to obtain the wiring structure 1 of FIG. 1.

In one embodiment, a semiconductor chip 42 (FIG. 3) is electrically connected and bonded to the second circuit layer 28 of the upper conductive structure 2 through a plurality of first connecting elements 44 (e.g., solders or bumps). Then, the upper conductive structure 2, the adhesion layer 12 and the lower conductive structure 3 are singulated concurrently, so as to from a package structure 4 as shown in FIG. 3. The package structure 4 includes a wiring structure 1b and the semiconductor chip 42. The wiring structure 1b of FIG. 3 includes a singulated upper conductive structure 2b and a singulated lower conductive structure 3b. That is, a lateral peripheral surface 27b of the upper conductive structure 2b, a lateral peripheral surface 33b of the lower conductive structure 3b and a lateral peripheral surface of the adhesion layer 12 are substantially coplanar with each other. Then, the second upper circuit layer 38' of the lower conductive structure 3b is electrically connected and bonded to the substrate 46 (e.g., a mother board such as a PCB board) through the second connecting elements 48 (e.g., solders or bumps).

Figure 45:
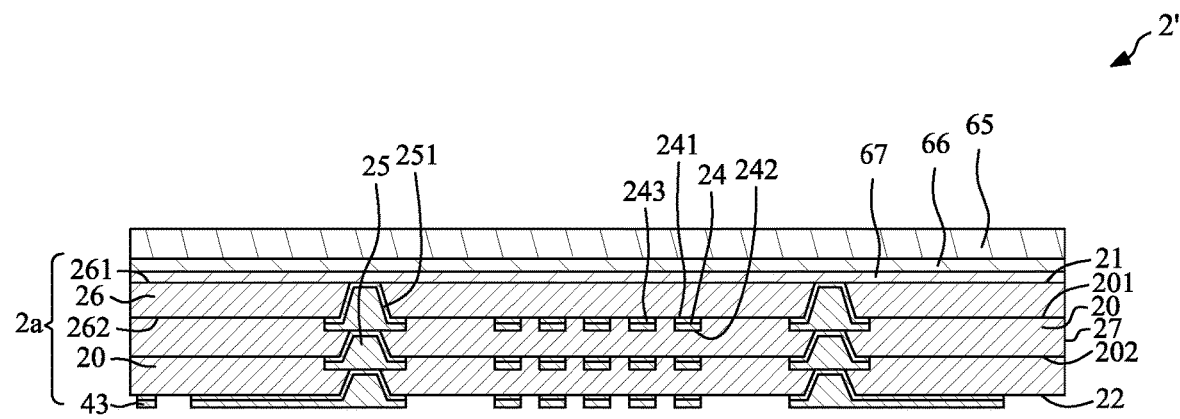
FIG. 45 illustrates one or more stages of an example of a method for manufacturing a wiring structure according to some embodiments of the present disclosure.

FIG. 45 through FIG. 48 illustrate a method for manufacturing a wiring structure according to some embodiments of the present disclosure. In some embodiments, the method is for manufacturing the wiring structure 1a shown in FIG. 2. The initial stages of the illustrated process are the same as, or similar to, the stages illustrated in FIG. 7 to FIG. 37. FIG. 45 depicts a stage subsequent to that depicted in FIG. 37.

Referring to FIG. 45, a fiducial mark 43 and the bottommost first circuit layer 24 are formed concurrently and are at the same layer. Thus, the fiducial mark 43 is disposed on and protrudes from the bottom surface 22 of the upper conductive structure 2. Then, the upper conductive structure 2, the carrier 65, the release layer 66 and the conductive layer 67 are cut concurrently to form a plurality of strips 2'. Each of the strips 2' includes an upper conductive structure 2a that is a strip structure. Then, the strips 2' are tested. Alternatively, the upper conductive structure 2 may be tested before the cutting process.

Figure 46:
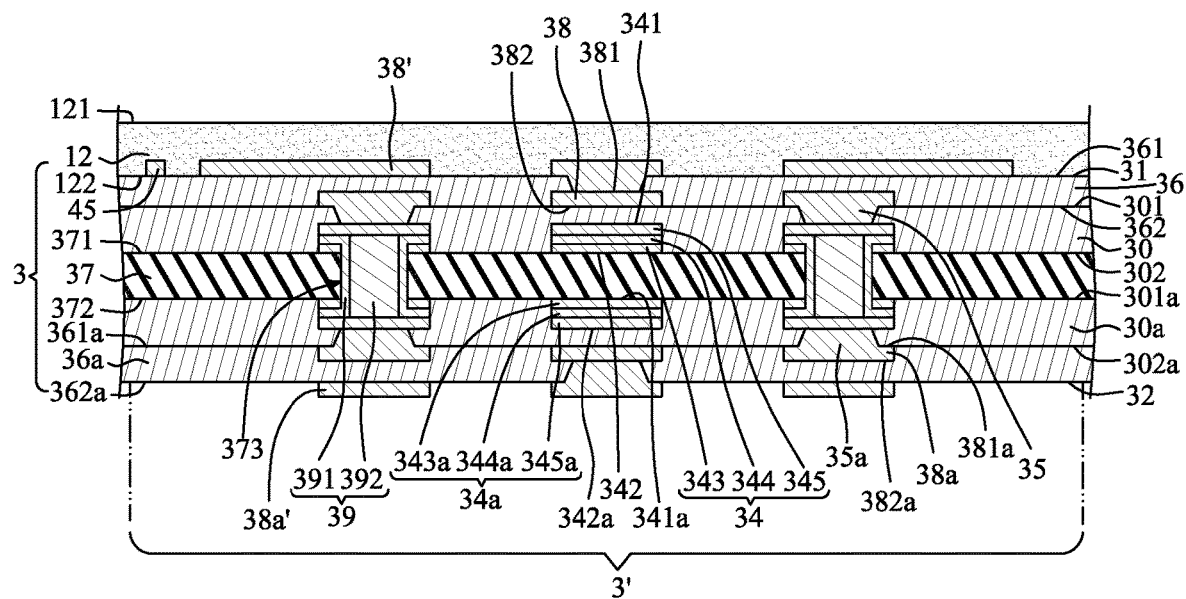
FIG. 46 illustrates one or more stages of an example of a method for manufacturing a wiring structure according to some embodiments of the present disclosure.

Referring to FIG. 46, a fiducial mark 45 and the second upper circuit layer 38' are formed concurrently and at the same layer. Thus, the fiducial mark 45 is disposed on and protrudes from the top surface 31 of the lower conductive structure 3. The lower conductive structure 3 has a plurality of strip areas 3'. Then, the strip areas 3' are tested. Then, an adhesion layer 12 is formed or applied on the top surface 31 of the lower conductive structure 3.

Figure 47:
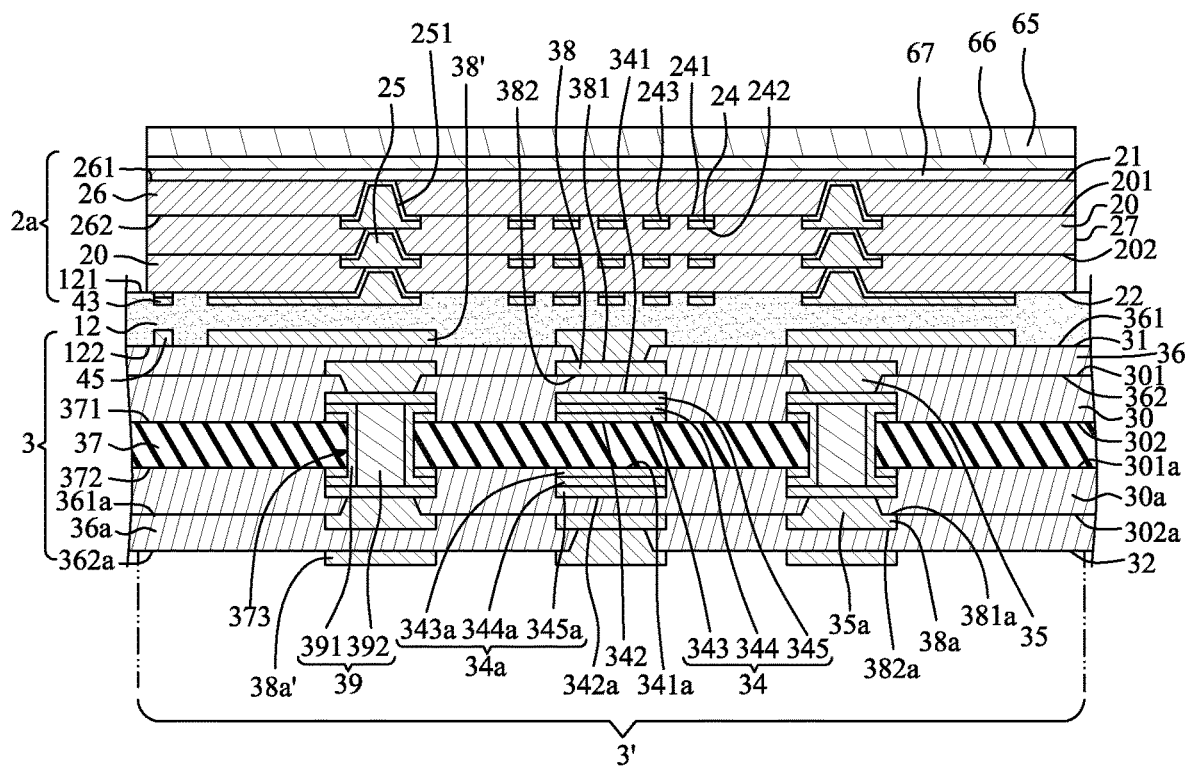
FIG. 47 illustrates one or more stages of an example of a method for manufacturing a wiring structure according to some embodiments of the present disclosure.

Referring to FIG. 47, the strips 2' are attached to the strip areas 3' of the lower conductive structure 3 through the adhesion layer 12. The upper conductive structure 2a faces and is attached to the lower conductive structure 3. During the attaching process, the fiducial mark 43 of the upper conductive structure 2a is aligned with the fiducial mark 45 of the lower conductive structure 3, so that the relative position of the upper conductive structure 2a and the lower conductive structure 3 are secured. In one embodiment, known good strip 2' is attached to known good strip area 3' of the lower conductive structure 3. For example, a desired yield of the wiring structure 1a (FIG. 2) may be set to be 80%. That is, (the yield of the upper conductive structure 2a)*(the yield of the strip area 3' of the lower conductive structure 3) should be greater than or equal to 80%. If a yield of the upper conductive structure 2a (or strip 2') is less than a predetermined yield such as 80% (which is defined as bad element or unqualified element), then, the bad (or unqualified) upper conductive structure 2a (or strip 2') is disregarded. If a yield of the upper conductive structure 2a (or strip 2') is greater than the predetermined yield such as 80% (which is defined as known good element or qualified element), then, the known good upper conductive structure 2a (or strip 2') can be used. In addition, If a yield of the strip area 3' of the lower conductive structure 3 is less than a predetermined yield such as 80% (which is defined as bad element or unqualified element), then, the bad (or unqualified) strip area 3' is marked and will not be bonded with any strip 2'. If a yield of the strip area 3' of the lower conductive structure 3 is greater than the predetermined yield such as 80% (which is defined as known good element or qualified element), then, the known good upper conductive structure 2a (or strip 2') can be bonded to the known good strip area 3' of the lower conductive structure 3. It is noted that the upper conductive structure 2a (or strip 2') having a yield of 80% cannot be bonded to the strip area 3' of the lower conductive structure 3 having a yield of 80%, since the resultant yield of the wiring structure 1a (FIG. 2) is 64%, which is lower than the desired yield of 80%. The upper conductive structure 2a (or strip 2') having a yield of 80% should be bonded to the strip area 3' of the lower conductive structure 3 having a yield of 100%, thus, the resultant yield of the wiring structure 1a (FIG. 2) can be 80%. In addition, an upper conductive structure 2a (or strip 2') having a yield of 90% can be bonded to the strip area 3' of the lower conductive structure 3 having a yield of greater than 90%, since the resultant yield of the wiring structure 1a (FIG. 2) can be greater than 80%.

Figure 48:
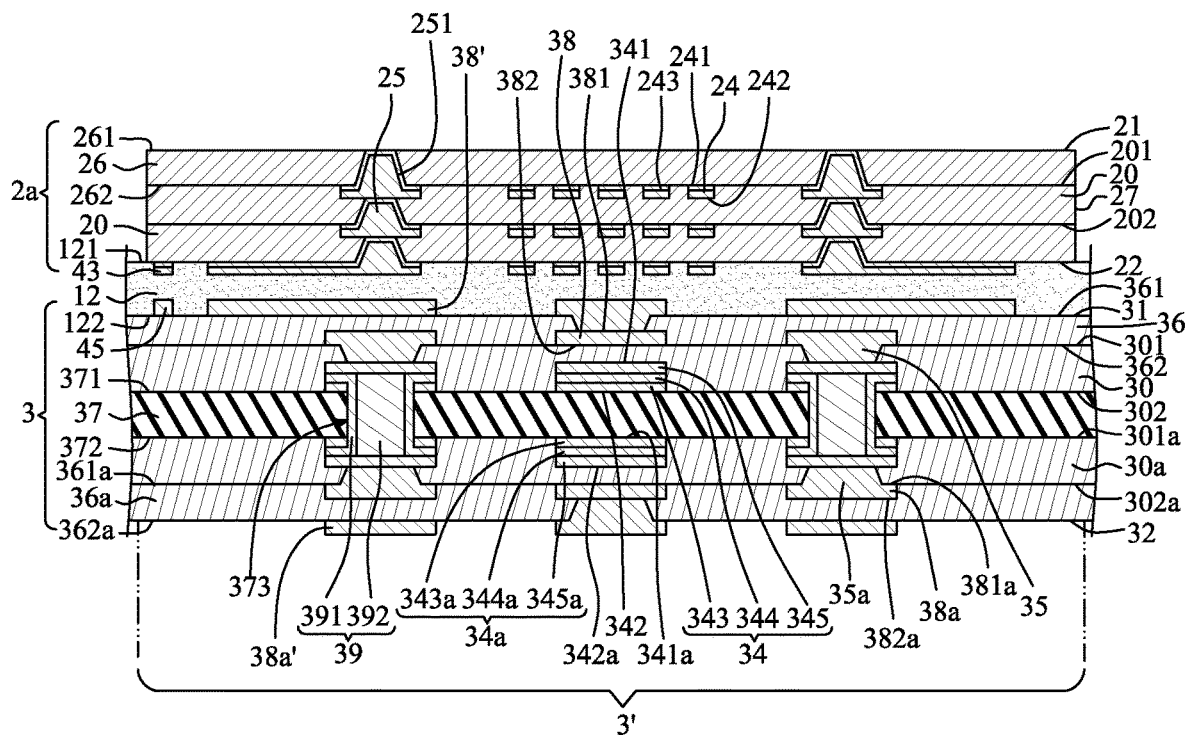
FIG. 48 illustrates one or more stages of an example of a method for manufacturing a wiring structure according to some embodiments of the present disclosure.

Referring to FIG. 48, the adhesion layer 12 is cured. Then, the carrier 65, the release layer 66 and the conductive layer 67 are removed. Then, the stages subsequent to that shown in FIG. 48 of the illustrated process are similar to the stages illustrated in FIG. 41 to FIG. 44. Then, the lower conductive structure 3 and the adhesion layer 12 are cut along the strip areas 3', so as to obtain the wiring structure 1a of FIG. 2.

Figure 49:
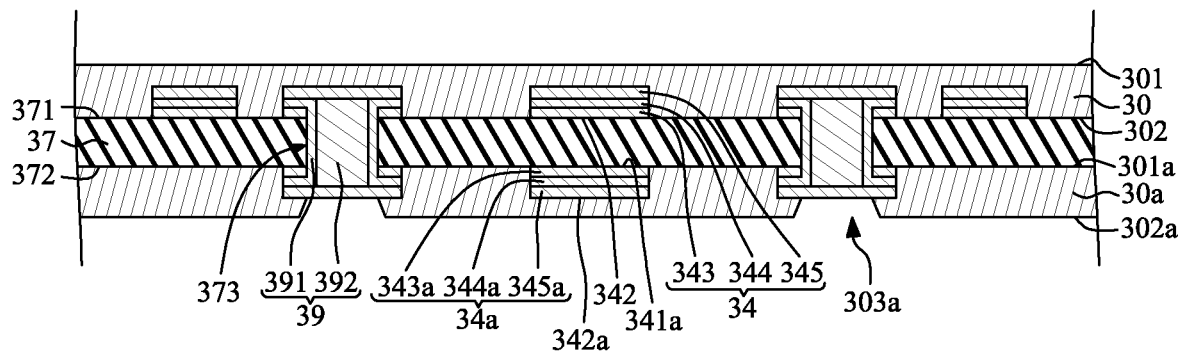
FIG. 49 illustrates one or more stages of an example of a method for manufacturing a wiring structure according to some embodiments of the present disclosure.

FIG. 49 through FIG. 59 illustrate a method for manufacturing a wiring structure according to some embodiments of the present disclosure. In some embodiments, the method is for manufacturing the wiring structure 1c shown in FIG. 4. The initial stages of the illustrated process are the same as, or similar to, the stages illustrated in FIG. 7 to FIG. 15. FIG. 49 depicts a stage subsequent to that depicted in FIG. 15.

Figure 50:
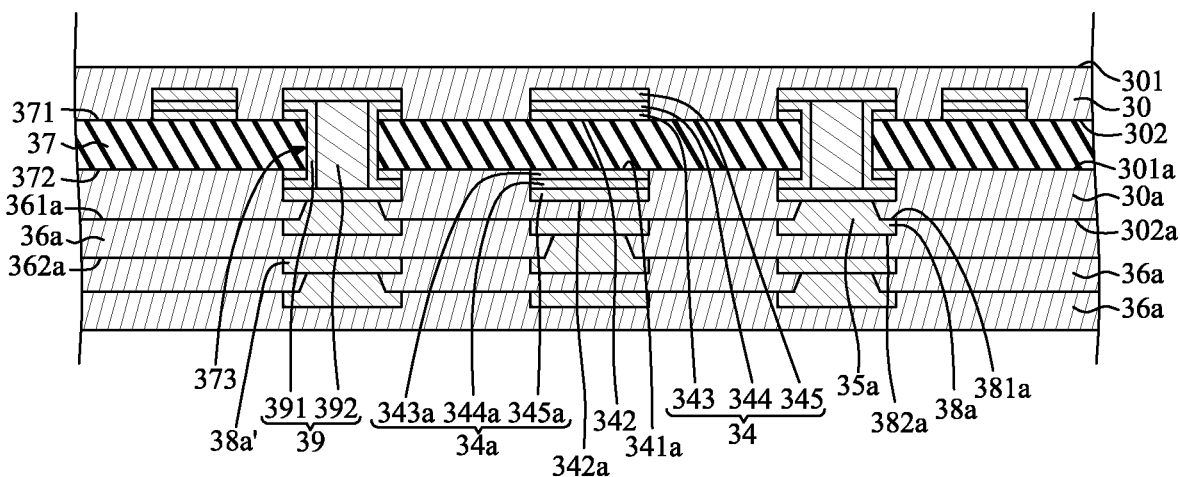
FIG. 50 illustrates one or more stages of an example of a method for manufacturing a wiring structure according to some embodiments of the present disclosure.
Figure 51:
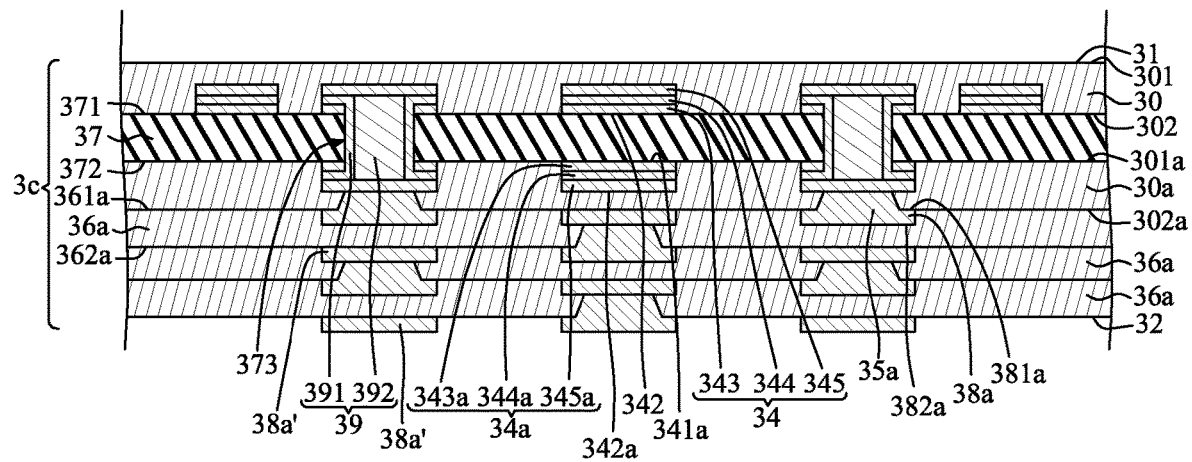
FIG. 51 illustrates one or more stages of an example of a method for manufacturing a wiring structure according to some embodiments of the present disclosure.

Referring to FIG. 49 through FIG. 51, a lower conductive structure 3c is provided. The lower conductive structure 3c is manufactured as follows. Referring to FIG. 49, at least one through hole 303a is formed to extend through the first lower dielectric layer 30a to expose a portion of the first lower circuit layer 34a by drilling technique or other suitable technique(s). It is noted that no through hole is formed on the first upper dielectric layer 30.

Referring to FIG. 50, a second lower circuit layer 38a is formed or disposed on the first lower dielectric layer 30a. Then, three second lower dielectric layers 36a and two second lower circuit layers 38a' are formed or disposed on the first lower dielectric layer 30a.

Referring to FIG. 51, a bottommost lower circuit layers 38a' is formed or disposed on the bottommost second lower dielectric layers 36a, so as to obtain a lower conductive structure 3c. In the lower conductive structure 3c, the top surface 31 of the lower conductive structure 3c is the stop surface 301 of first upper dielectric layer 30, which is substantially flat.

Figure 52:
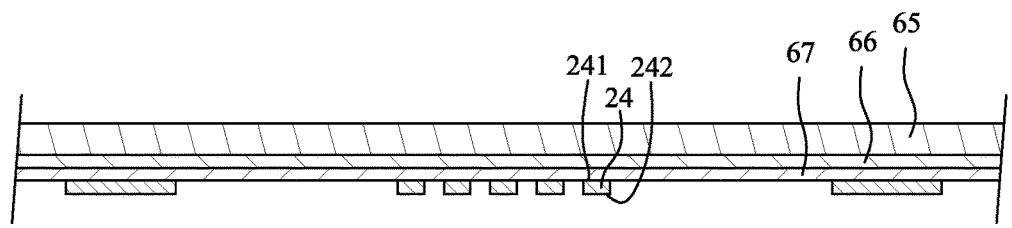
FIG. 52 illustrates one or more stages of an example of a method for manufacturing a wiring structure according to some embodiments of the present disclosure.

Referring to FIG. 52 through FIG. 55, an upper conductive structure 2c is provided. The upper conductive structure 2c is manufactured as follows. Referring to FIG. 52, a carrier 65 is provided. A release layer 66 is coated on the bottom surface of the carrier 65. A conductive layer 67 (e.g., a seed layer) is formed or disposed on the release layer 66 by physical vapor deposition (PVD) technique or other suitable technique(s). Then, a topmost first circuit layer 24 is formed on the conductive layer 67.

Figure 53:
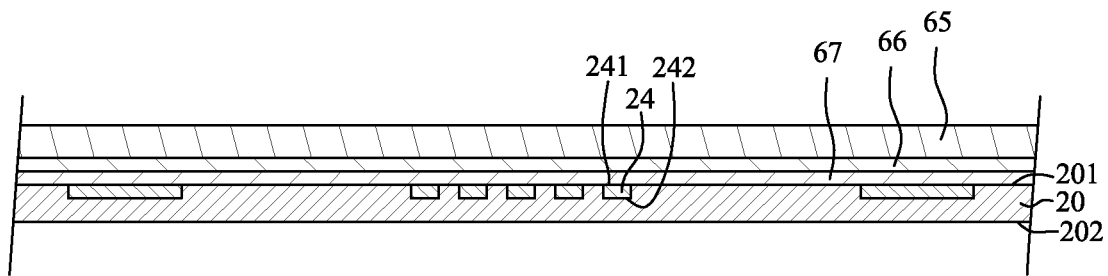
FIG. 53 illustrates one or more stages of an example of a method for manufacturing a wiring structure according to some embodiments of the present disclosure.

Referring to FIG. 53, a topmost first dielectric layers 20 is formed on the conductive layer 67 by coating technique or other suitable technique(s), to cover the topmost first circuit layer 24.

Figure 54:
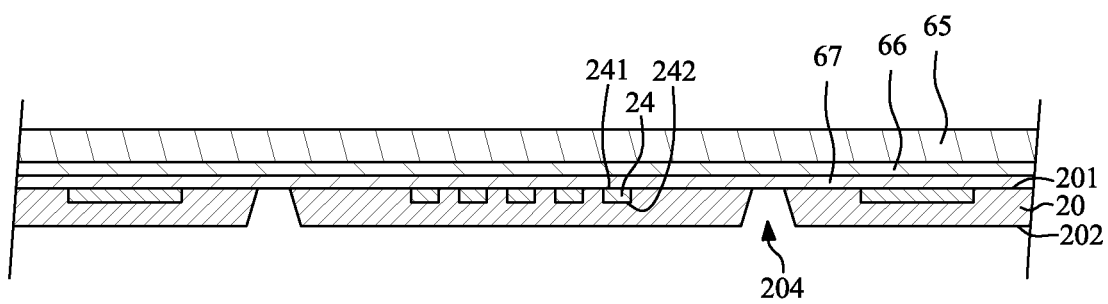
FIG. 54 illustrates one or more stages of an example of a method for manufacturing a wiring structure according to some embodiments of the present disclosure.

Referring to FIG. 54, at least one through hole 204 is formed to extend through the first dielectric layers 20 to expose a portion of the conductive layer 67 by exposure and development technique or other suitable technique(s).

Figure 55:
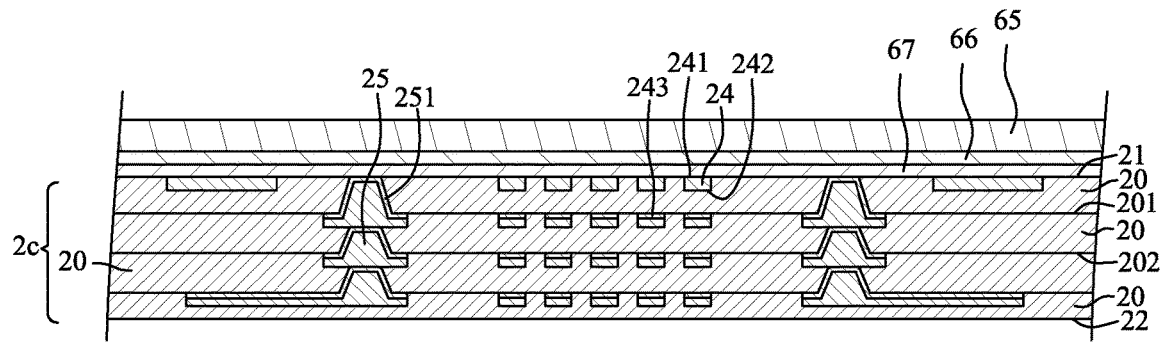
FIG. 55 illustrates one or more stages of an example of a method for manufacturing wiring structure according to some embodiments of the present disclosure.

Referring to FIG. 55, a plurality of first dielectric layers 20, a plurality of first circuit layers 24 and a plurality of inner vias 25 are formed on the topmost first dielectric layers 20, so as to obtain the upper conductive structure 2c. As shown in FIG. 55, the bottommost first dielectric layer 20 may cover the bottommost first circuit layer 24. Thus, the entire bottom surface 22 of the upper conductive structure 2c (e.g., the bottom surface 202 of the bottommost first dielectric layer 20) is substantially flat.

Figure 56:
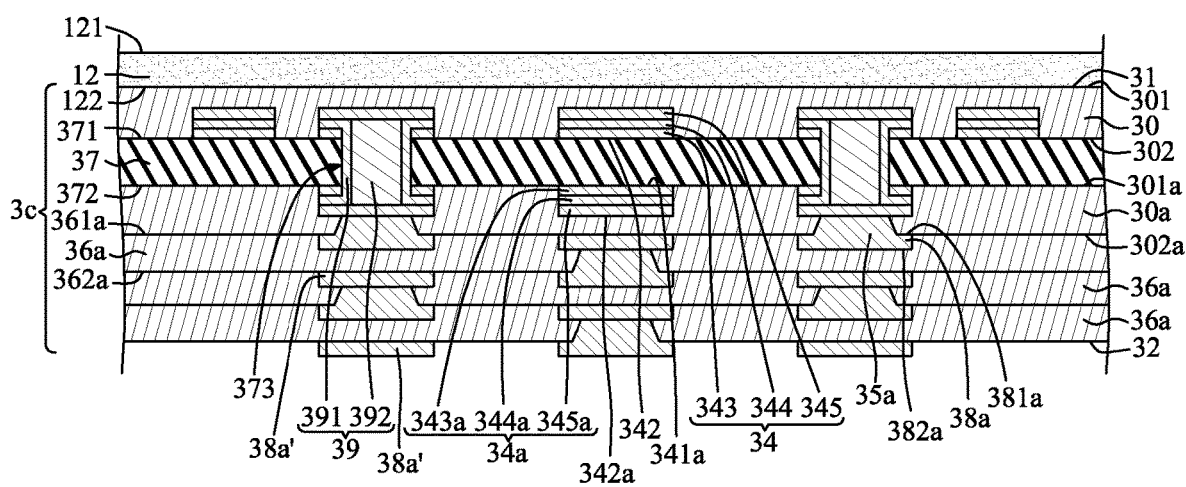
FIG. 56 illustrates one or more stages of an example of a method for manufacturing a wiring structure according to some embodiments of the present disclosure.

Referring to FIG. 56, an adhesion layer 12 is formed or applied on the top surface 31 of the lower conductive structure 3.

Figure 57:
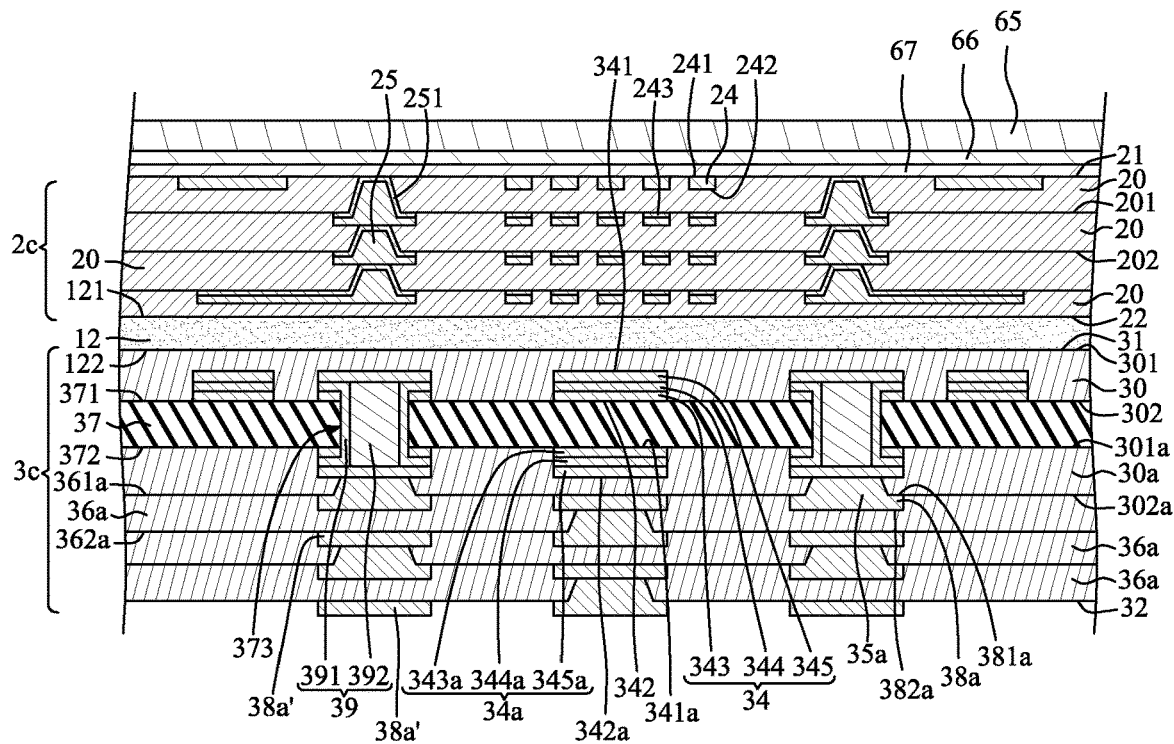
FIG. 57 illustrates one or more stages of an example of a method for manufacturing a wiring structure according to some embodiments of the present disclosure.

Referring to FIG. 57, the upper conductive structure 2c is attached to the lower conductive structure 3c through the adhesion layer 12. In one embodiment, known good upper conductive structure 2c is attached to known good lower conductive structure 3c. Then, the adhesion layer 12 is cured. The adhesion layer 12 adheres the bottom surface 22 of the upper conductive structure 2c and the top surface 31 of the lower conductive structure 3c. Thus, the entire top surface 121 and the entire bottom surface 122 of the adhesion layer 12 are both substantially flat. The adhesion layer 12 does not include or contact a horizontal circuit layer. That is, there is no horizontal circuit layer disposed in or embedded in the adhesion layer 12.

Figure 58:
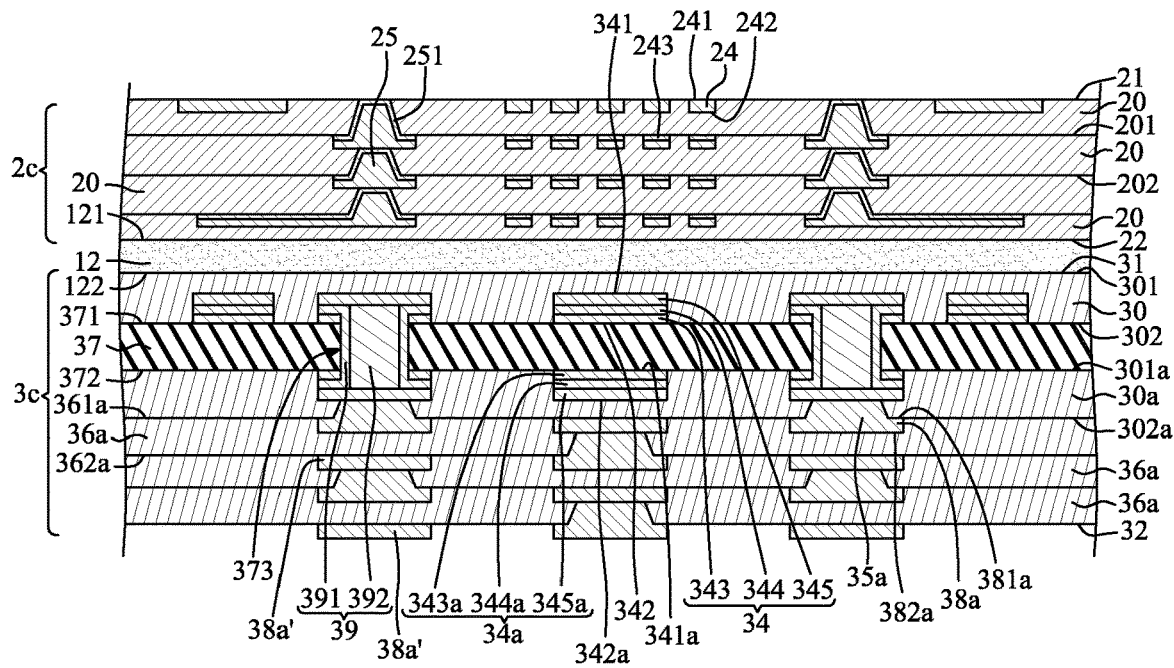
FIG. 58 illustrates one or more stages of an example of a method for manufacturing a wiring structure according to some embodiments of the present disclosure.

Referring to FIG. 58, the carrier 65, the release layer 66 and the conductive layer 67 are removed so as to expose a portion of the inner via 25 and the topmost first dielectric layers 20. The top surface 241 of the topmost first circuit layer 24 may be substantially coplanar with the top surface 201 of the topmost first dielectric layer 20.

Figure 59:
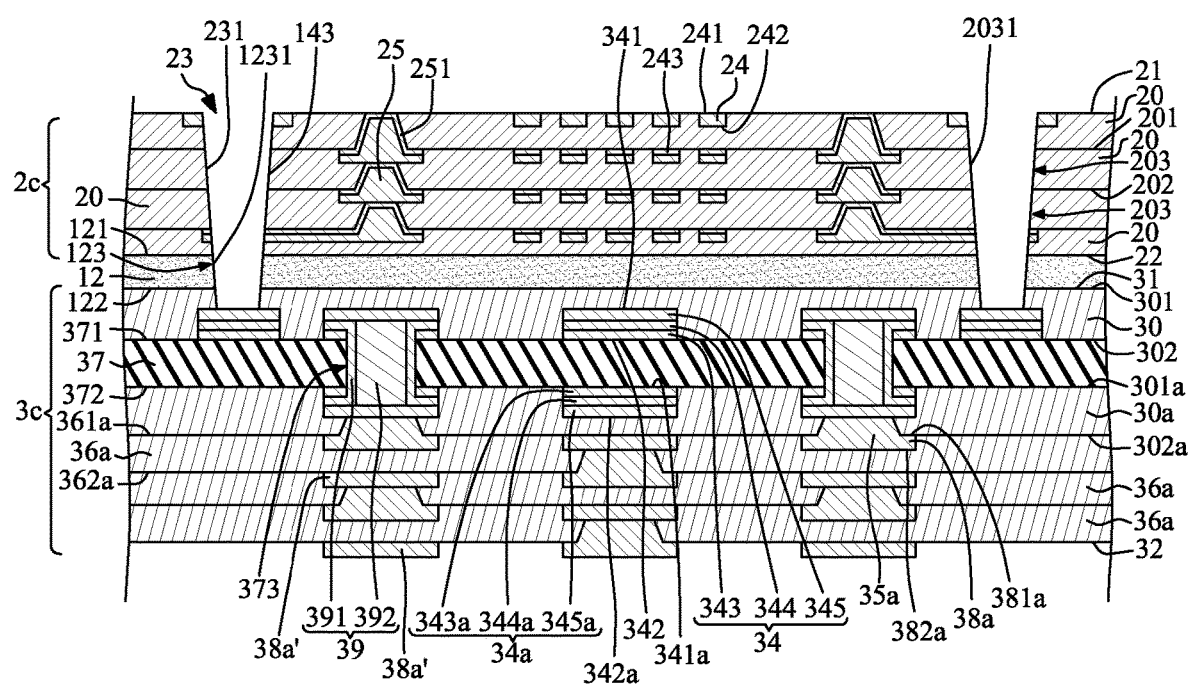
FIG. 59 illustrates one or more stages of an example of a method for manufacturing a wiring structure according to some embodiments of the present disclosure.

Referring to FIG. 59, at least one through hole 23 is formed to extend through at least a portion of the upper conductive structure 2c, the adhesion layer 12 and a portion (e.g., the first upper dielectric layer 30) of the lower conductive structure 3c by drilling to exposes a circuit layer (e.g., the first upper circuit layer 34) of the lower conductive structure 3c. The through hole 23 may further extend through a portion of the topmost first circuit layer 24 of the upper conductive structure 2c. Then, a conductive metal material is formed or disposed in the through hole 23 to form an outer via 14, so as to obtain the wiring structure 1c of FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
   an upper conductive structure including at least one dielectric layer and at least one circuit layer in contact with the dielectric layer;
   a lower conductive structure including at least one dielectric layer and at least one circuit layer in contact with the dielectric layer;
   an adhesion layer interposed between the upper conductive structure and the lower conductive structure to bond the upper conductive structure and the lower conductive structure together; and
   at least one via extending through at least a portion of the upper conductive structure and the adhesion layer, and electrically connected to the circuit layer of the lower conductive structure,
   wherein a line width/line space (L/S) of the circuit layer of the lower conductive structure is greater than a line width/line space (L/S) of the circuit layer of the upper conductive structure, wherein each of the at least one dielectric layer of the upper conductive structure defines a through hole having an inner surface, the adhesion layer defines a through hole having an inner surface, and the inner surface of the through hole of the adhesion layer and the inner surfaces of the through holes of the at least one dielectric layer are coplanar with each other, and a material of the adhesion layer is transparent.

2. The wiring structure of claim 1, wherein each of the dielectric layers of the upper conductive structure defines a through hole, the adhesion layer defines a through hole, and the through hole of the adhesion layer and the through holes of the dielectric layers are collectively configured to a single through hole for accommodating the via.

3. The wiring structure of claim 1, wherein each of the dielectric layers of the upper conductive structure defines a through hole having an inner surface, the adhesion layer defines a through hole having an inner surface, and cross-sectional views of the inner surface of the through hole of the adhesion layer and the inner surfaces of the through holes of the dielectric layers are segments of a substantially straight line.

4. The wiring structure of claim 1, wherein the via extends to contact a portion of the lower conductive structure.

5. The wiring structure of claim 1, wherein the via contacts a topmost circuit layer of the lower conductive structure.

6. The wiring structure of claim 1, wherein the upper conductive structure has a top surface and a bottom surface, the adhesion layer has a top surface and a bottom surface, the bottom surface of the upper conductive structure is attached to the top surface of the adhesion layer, the via extends from the top surface of the upper conductive structure to the bottom surface of the adhesion layer, and a peripheral surface of the via is a substantially continuous plane.

7. The wiring structure of claim 1, wherein a surface roughness of a boundary between two dielectric layers of the upper conductive structure is greater than a surface roughness of a boundary between a dielectric layer of the upper conductive structure and the adhesion layer.

8. The wiring structure of claim 1, wherein the upper conductive structure includes a plurality of dielectric layers including the at least one dielectric layer, the lower conductive structure includes a plurality of dielectric layers, and a thickness of the plurality of dielectric layers of the upper conductive structure is less than a thickness of the plurality of dielectric layers of the lower conductive structure.

9. The wiring structure of claim 1, wherein the lower conductive structure includes a core portion, and the at least one dielectric layer of the lower conductive structure is disposed on the core portion.

10. The wiring structure of claim 1, wherein the line width/line space (L/S) of the circuit layer of the lower conductive structure is greater than or equal to 10 µm/10 µm, and the line width/line space (L/S) of the circuit layer of the upper conductive structure is less than or equal to 2 µm/2 µm.

11. The wiring structure of claim 1, wherein the upper conductive structure includes a plurality of dielectric layers including the at least one dielectric layer, a plurality of circuit layers including the at least one circuit layer, and at least one inner via disposed between two circuit layers within the upper conductive structure and electrically connected to the two circuit layers, where a thickness axis along which layers are stacked, and a lateral axis perpendicular to the thickness axis, where the inner via tapers in an upward direction along the thickness axis, and the at least one via includes at least one outer via tapering in a downward direction along the thickness axis, where the upward direction and the downward direction are opposite directions along the thickness axis, and the outer via is closest to the peripheral surfaces on opposing sides of the wiring structure along the lateral axis.

12. The wiring structure of claim 1, wherein the via extends through the upper conductive structure from a top surface of the upper conductive structure to the lower conductive structure, and the top surface of the upper conductive structure is defined as a carrying surface for carrying a chip.

13. The wiring structure of claim 1, wherein the upper conductive structure further includes a plurality of inner vias electrically connected to the circuit layer of the upper conductive structure, and at least three lines of the circuit layer are disposed between two adjacent inner vias of the upper conductive structure.

14. The wiring structure of claim 1, wherein the upper conductive structure further includes a plurality of inner vias electrically connected to the circuit layer of the upper conductive structure, and all of the inner vias of the upper conductive structure taper upward.

15. The wiring structure of claim 1, wherein the upper conductive structure further includes at least one inner via electrically connected to the circuit layer of the upper conductive structure, the at least one inner via includes a narrow portion and a wide portion opposite to the narrow portion, and the wide portion of the at least one inner via is disposed adjacent to and spaced apart from a top surface of the adhesion layer.

16. A wiring structure, comprising:
an upper conductive structure including at least one dielectric layer, at least one circuit layer in contact with the dielectric layer and at least one inner via electrically connected to the circuit layer;
a lower conductive structure including at least one dielectric layer and at least one circuit layer in contact with the dielectric layer;
an adhesion layer interposed between the upper conductive structure and the lower conductive structure to bond the upper conductive structure and the lower conductive structure together; and
at least one outer via extending through at least a portion of the upper conductive structure and the adhesion layer, and electrically connected to the circuit layer of the lower conductive structure, wherein a line width/line space (L/S) of the circuit layer of the lower conductive structure is greater than a line width/line space (L/S) of the circuit layer of the upper conductive structure, wherein each of the at least one dielectric layer of the upper conductive structure defines a through hole having an inner surface, the adhesion layer defines a through hole having an inner surface, and the inner surface of the through hole of the adhesion layer and the inner surfaces of the through holes of the at least one dielectric layer are coplanar with each other, and a material of the adhesion layer is transparent.

17. The wiring structure of claim 16, wherein a peripheral surface of the adhesion layer is substantially coplanar with a peripheral surface of the upper conductive structure.

18. The wiring structure of claim 16, wherein a size of the adhesion layer is substantially equal to a size of the upper conductive structure from top view.

19. The wiring structure of claim 16, wherein the upper conductive structure includes a plurality of dielectric layers including the at least one dielectric layer and a plurality of circuit layers including the at least one circuit layer, the at least one inner via is disposed between two circuit layers within the upper conductive structure and electrically connected to the two circuit layers, where a thickness axis along which layers are stacked, and a lateral axis perpendicular to the thickness axis, where the inner via tapers in an upward direction along the thickness axis, and the outer via tapers in a downward direction along the thickness axis, where the upward direction and the downward direction are opposite directions along the thickness axis, and the outer via is closest to the peripheral surfaces on opposing sides of the wiring structure along the lateral axis.

20. The wiring structure of claim 16, wherein a material of the adhesion layer is transparent.

21. A wiring structure, comprising:
an upper conductive structure including at least one dielectric layer and at least one circuit layer in contact with the dielectric layer;
a lower conductive structure including at least one dielectric layer and at least one circuit layer in contact with the dielectric layer;
an adhesion layer interposed between the upper conductive structure and the lower conductive structure to bond the upper conductive structure and the lower conductive structure together; and
at least one via extending through the upper conductive structure from a top surface of the upper conductive structure to the lower conductive structure, wherein the top surface of the upper conductive structure is defined as a carrying surface for carrying a chip, wherein a line width/line space (L/S) of the circuit layer of the lower conductive structure is greater than a line width/line space (L/S) of the circuit layer of the upper conductive structure, wherein each of the at least one dielectric layer of the upper conductive structure defines a through hole having an inner surface, the adhesion layer defines a through hole having an inner surface, and the inner surface of the through hole of the adhesion layer and the inner surfaces of the through holes of the at least one dielectric layer are coplanar with each other, and a material of the adhesion layer is transparent.

22. The wiring structure of claim 21, wherein the chip is electrically connected to the circuit layer of the upper conductive structure.

23. The wiring structure of claim 21, wherein a portion of the top surface of the upper conductive structure is exposed to air.

24. The wiring structure of claim 21, wherein the upper conductive structure includes a plurality of dielectric layers including the at least one dielectric layer, a plurality of circuit layers including the at least one circuit layer, and at least one inner via disposed between two circuit layers within the upper conductive structure and electrically connected to the two circuit layers, where a thickness axis along which layers are stacked, and a lateral axis perpendicular to the thickness axis, where the inner via tapers in an upward direction along the thickness axis, and the at least one via includes at least one outer via tapering in a downward direction along the thickness axis, where the upward direction and the downward direction are opposite directions along the thickness axis, and the outer via is closest to the peripheral surfaces on opposing sides of the wiring structure along the lateral axis.

* * * * *